United States Patent [19]

Saitoh et al.

[11] Patent Number: 4,650,736
[45] Date of Patent: Mar. 17, 1987

[54] LIGHT RECEIVING MEMBER HAVING PHOTOSENSITIVE LAYER WITH NON-PARALLEL INTERFACES

[75] Inventors: Keishi Saitoh, Ibaraki; Masahiro Kanai, Tokyo; Tetsuo Sueda, Chofu; Teruo Misumi, Kawasaki; Yoshio Tsuezuki, Toride; Kyosuke Ogawa, Tokyo, all of Japan

[73] Assignee: Canon Kabushiki Kaisha, Tokyo, Japan

[21] Appl. No.: 699,868

[22] Filed: Feb. 8, 1985

[30] Foreign Application Priority Data

Feb. 13, 1984 [JP] Japan .................................. 59-24685
Feb. 24, 1984 [JP] Japan .................................. 59-33622
Mar. 5, 1984 [JP] Japan .................................. 59-41836

[51] Int. Cl.$^4$ .................................................. G03G 5/082
[52] U.S. Cl. .................................. 430/57; 430/65; 430/69; 430/84
[58] Field of Search .................. 430/56, 57, 58, 65, 430/69, 84, 127

[56] References Cited

U.S. PATENT DOCUMENTS

| | | | |
|---|---|---|---|
| 4,359,514 | 11/1982 | Shimizu et al. | 430/65 |
| 4,492,745 | 1/1985 | Mimura et al. | 430/67 |
| 4,514,483 | 4/1985 | Matsuura et al. | 430/84 |

FOREIGN PATENT DOCUMENTS

| | | | |
|---|---|---|---|
| 2733187 | 1/1978 | Fed. Rep. of Germany | 430/65 |
| 56-150754 | 11/1981 | Japan | 430/65 |

Primary Examiner—John L. Goodrow
Attorney, Agent, or Firm—Fitzpatrick, Cella, Harper & Scinto

[57] ABSTRACT

A light receiving member comprises a light receiving layer of a multi-layer structure having at least one photosensitive layer comprising an amorphous material containing silicon atoms on a substrate, said photosensitive layer having at least one pair of non-parallel interfaces within a short range and said non-parallel interfaces being arranged in a large number in at least one direction within a plane perpendicular to the layer thickness direction.

42 Claims, 28 Drawing Figures

FIG. 15
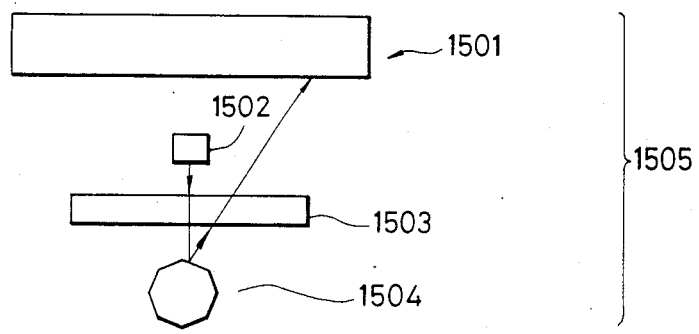
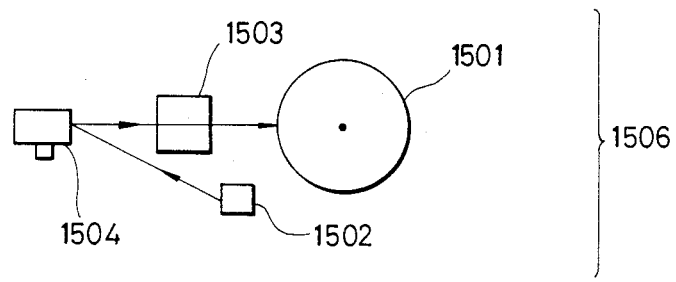

LIGHT RECEIVING MEMBER HAVING PHOTOSENSITIVE LAYER WITH NON-PARALLEL INTERFACES

BACKGROUND OF THE INVENTION

1. Field of the invention

This invention relates to a light receiving member having sensitivity to electromagnetic waves such as light [herein used in a broad sense, including ultraviolet rays, visible light, infrared rays, X-rays and gamma-rays]. More particularly, it pertains to a light receiving member suitable for using a coherent light such as laser beam.

2. Description of the prior art

As the method for recording a digital image information as an image, there have been well known the methods in which an electrostatic latent image is formed by scanning optically a light receiving member with a laser beam modulated corresponding to a digital image information, then said latent image is developed, followed by processing such as transfer or fixing, if desired, to record an image. Among them, in the image forming method employing electro-photography, image recording has been generally practiced with the use of a small size and inexpensive He-Ne laser or a semiconductor laser (generally having an emitted wave-length of 650–820 nm).

In particular, as the light receiving member for electrophotography which is suitable when using a semiconductor laser, an amorphous material containing silicon atoms (hereinafter written briefly as "A-Si") as disclosed in Japanese Laid-open Patent Application Nos. 86341/1979 and 83746/1981 is attracting attention for its high Vickers hardness and non-polluting properties in social aspect in addition to the advantage of being by far superior in matching in its photosensitive region as compared with other kinds of light receiving members.

However, when the photosensitive layer is made of a single A-Si layer, for ensuring dark resistance of $10^{12}$ ohm.cm or higher required for electrophotography while maintaining high photosensitivity, it is necessary to incorporate structurally hydrogen atoms or halogen atoms or boron atoms in addition thereto in controlled form within specific ranges of amounts. Accordingly, control of layer formation is required to be performed severely, whereby tolerance in designing of a light receiving member is considerably limited.

As attempts to enlarge this tolerance in designing, namely to enable effective utilization of its high photosensitivity in spite of somewhat lower dark resistance, there have been proposed a light receiving layer with a multi-layer structure of two or more laminated layers with different conductivity characteristics with formation of a depletion layer within the light receiving layer, as disclosed in Japanese Laid-open Patent Application Nos. 121743/1979, 4053/1982 and 4172/1982, or a light receiving member with a multi-layer structure in which a barrier layer is provided between the substrate and the photosensitive layer and/or on the upper surface of the photosensitive layer, thereby enhancing apparent dark resistance of the light receiving layer as a whole, as disclosed in Japanese Laid-open Patent Application Nos. 52178/1982, 52179/1982, 52180/1982, 58159/1982, 58160/1982 and 58161/1982.

According to such proposals, A-Si type light receiving members have been greatly advanced in tolerance in designing of commercialization thereof or easiness in management of its production and productivity, and the speed of development toward commercialization is now further accelerated.

When carrying out laser recording by use of such a light receiving member having a light receiving layer of a multi-layer structure, due to irregularity in thickness of respective layers, and also because of the laser beam which is an coherent monochromatic light, it is possible that the respective reflected lights reflected from the free surface on the laser irradiation side of the light receiving layer and the layer interface between the respective layers constituting the light receiving layer and between the substrate and the light receiving layer (hereinafter "interface" is used to mean comprehensively both the free surface and the layer interface) may undergo interference.

Such an interference phenomenon results in the so-called interference fringe pattern in the visible image formed and causes a poor image. In particular, in the case of forming a medium tone image with high gradation, bad appearance of the image will become marked.

Moreover, as the wavelength region of the semi-conductor laser beam is shifted toward longer wavelength, absorption of said laser beam in the photosensitive layer becomes reduced, whereby the above interference phenomenon becomes more marked.

This point is explained by referring to the drawings.

FIG. 1 shows a light $I_0$ entering a certain layer constituting the light receiving layer of a light receiving member, a reflected light $R_1$ from the upper interface 102 and a reflected light $R_2$ reflected from the lower interface 101.

Now, the average layer thickness of the layer is defined as d, its refractive index as n and the wavelength of the light as λ, and when the layer thickness of a certain layer is ununiform gently with a layer thickness difference of λ/2n or more, changes in absorbed light quantity and transmitted light quantity occur depending on to which condition of 2nd=mλ(m is an integer, reflected lights are strengthened with each other) and 2nd=(m+½)λ(m is an integer, reflected lights are weakened with each other) the reflected lights $R_1$ and $R_2$ conform.

In the light receiving member of a multi-layer structure, the interference effect as shown in FIG. 1 occurs at each layer, and there ensues a synergistic deleterious influence through respective interferences as shown in FIG. 2. For this reason, the interference fringe corresponding to said interference fringe pattern appears on the visible image transferred and fixed on the transfer member to cause bad images.

As the method for cancelling such an inconvenience, it has been proposed to subject the surface of the substrate to diamond cutting to provide unevenness of ±500 Å–±10000 Å, thereby forming a light scattering surface (as disclosed in Japanese Laid-open Patent Application No. 162975/1983); to provide a light absorbing layer by subjecting the aluminum substrate surface to black Alumite treatment or dispersing carbon, color pigment or dye in a resin (as disclosed in Japanese Laid-open Patent Application No. 165845/1982); and to provide a light scattering reflection preventive layer on the substrate surface by subjecting the aluminum substrate surface to satin-like Alumite treatment or by providing a sandy fine unevenness by sand blast (as disclosed in Japanese Laid-open Patent Application No. 16554/1982).

However, according to these methods of the prior art, the interference fringe pattern appearing on the image could not completely be cancelled.

For example, because only a large number of unevenness with specific sized are formed on the substrate surface according to the first method, although prevention of appearance of interference fringe through light scattering is indeed effected, regular reflection light component yet exists. Therefore, in addition to remaining of the interference fringe by said regular reflection light, enlargement of irradiated spot occurs due to the light scattering effect on the surface of the substrate to be a cause for substantial lowering of resolution.

As for the second method, such a black Alumite treatment is not sufficient for complete absorption, but reflected light from the substrate surface remains. Also, there are involved various inconveniences. For example, in providing a resin layer containing a color pigment dispersed therein, a phenomenon of degassing from the resin layer occurs during formation of the A-Si photosensitive layer to markedly lower the layer quality of the photosensitive layer formed, and the resin layer suffers from a damage by the plasma during formation of A-Si photosensitive layer to be deteriorated in its inherent absorbing function. Besides, worsening of the surface state deleteriously affects subsequent formation of the A-Si photosensitive layer.

In the case of the third method of irregularly roughening the substrate surface, as shown in FIG. 3, for example, the incident light $I_0$ is partly reflected from the surface of the light receiving layer 302 to become a reflected light $R_1$, with the remainder progressing internally through the light receiving layer 302 to become a transmitted light $I_1$. The transmitted light $I_1$ is partly scattered on the surface of the substrate 301 to become scattered lights $K_1$, $K_2$, $K_3$ ... $K_n$, with the remainder being regularly reflected to become a reflected light $R_2$, a part of which goes outside as an emitted light $R_3$. Thus, since the reflected light $R_1$ and the emitted light $R_3$ which is an interferable component remain, it is not yet possible to extinguish the interference fringe pattern.

On the other hand, if diffusibility of the surface of the substrate 301 is increased in order to prevent multiple reflections within the light receiving layer 302 through prevention of interference, light will be diffused within the light receiving layer 302 to cause halation, whereby resolution is disadvantageously lowered.

Particularly, in a light receiving member of a multi-layer structure, as shown in FIG. 4, even if the surface of the substrate 401 may be irregularly roughened, the reflected light $R_2$ from the first layer 402, the reflected light $R_1$ from the second layer 403 and the regularly reflected light $R_3$ from the surface of the substrate 401 are interfered with each other to form an interference fringe pattern depending on the respective layer thicknesses of the light receiving member. Accordingly, in a light receiving member of a multi-layer structure, it was impossible to completely prevent appearance of interference fringes by irregularly roughening the surface of the substrate 401.

In the case of irregularly roughening the substrate surface according to the method such as sand blasting, etc., the roughness will vary so much from lot to lot, and there is also nonuniformity in roughness even in the same lot, and therefore production control could be done with inconvenience. In addition, relatively large projections with random distributions are frequently formed, hence causing local breakdown of the light receiving layer during charging treatment.

On the other hand, in the case of simply roughening the surface of the substrate 501 regularly, as shown in FIG. 5, since the light-receiving layer 502 is deposited along the uneven shape of the surface of the substrate 501, the slanted plane of the unevenness of the substrate 501 becomes parallel to the slanted plane of the unevenness of the light receiving layer 502.

Accordingly, for the incident light on that portion, $2nd_1 = m\lambda$ or $2nd_1 = (m + \frac{1}{2})\lambda$ holds, to make it a light portion or a dark portion. Also, in the light receiving layer as a whole, since there is nonuniformity in which the maximum difference among the layer thicknesses $d_1$, $d_2$, $d_3$ and $d_4$ of the light receiving layer is $\lambda/2n$ or more, there appears a light and dark fringe pattern.

Thus, it is impossible to completely extinguish the interference fringe pattern by only roughening regularly the surface of the substrate 501.

Also, in the case of depositing a light receiving layer of a multi-layer structure on the substrate, the surface of which is regularly roughened, in addition to the interference between the regularly reflected light from the substrate surface and the reflected light from the light receiving layer surface as explained for light receiving member of a single layer structure in FIG. 3, interferences by the reflected lights from the interfaces between the respective layers participate to make the extent of appearance of interferance fringe pattern more complicated than in the case of the light receiving member of a single layer structure.

SUMMARY OF THE INVENTION

An object of the present invention is to provide a novel light receiving member sensitive to light, which has cancelled the drawbacks as described above.

Another object of the present invention is to provide a light receiving member which is suitable for image formation by use of coherent monochromatic light and also easy in production control.

Still another object of the present invention is to provide a light receiving member which can completely cancel both of the interference fringe pattern appearing during image formation and appearance of speckles on reversal developing.

Still another object of the present invention is to provide a light receiving member comprising a light receiving layer of a multi-layer structure having at least one photosensitive layer comprising an amorphous material containing silicon atoms on a substrate, said photosensitive layer having at least one pair of non-parallel interfaces within a short range and said non-parallel interfaces being arranged in a large number in at least one direction within a plane perpendicular to the layer thickness direction.

BRIEF DESCRIPTION OF THE DRAWINGS

FIG. 15 is a schematic illustration for explaining the image exposure device employed in Examples;

DESCRIPTION OF THE PREFERRED EMBODIMENTS

Referring now to the accompanying drawings, the present invention is to be described in detail.

Figure 1:
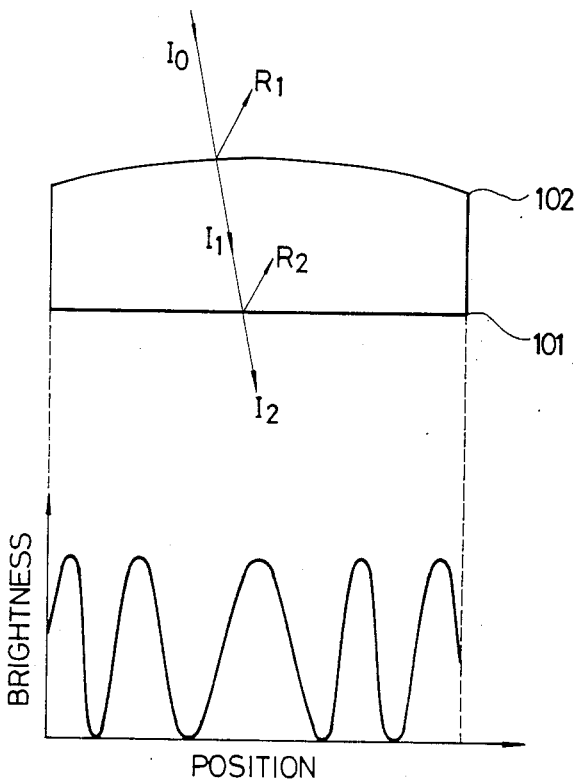
FIG. 1 is a schematic illustration of interference fringe in general.
Figure 2:
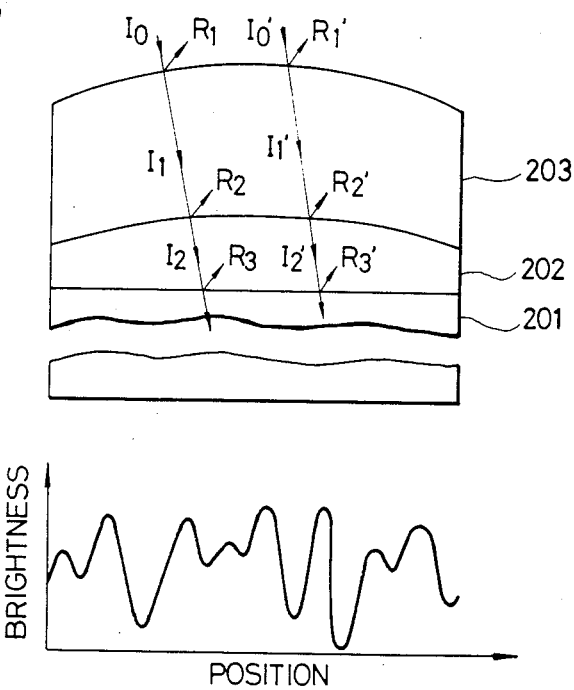
FIG. 2 is a schematic illustration of interference fringe in the case of a multi-layer light receiving member.
Figure 3:
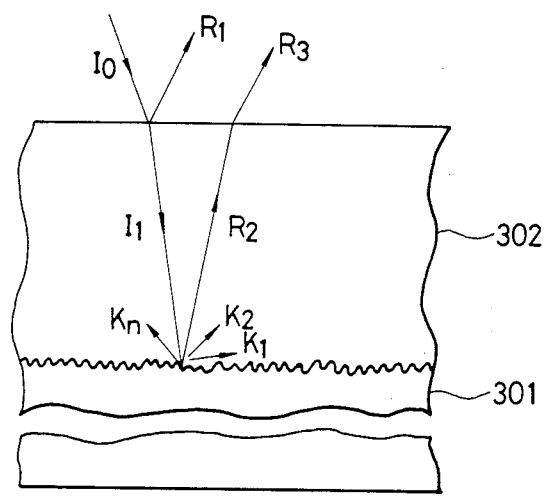
FIG. 3 is a schematic illustration of interference fringe by scattered light.
Figure 4:
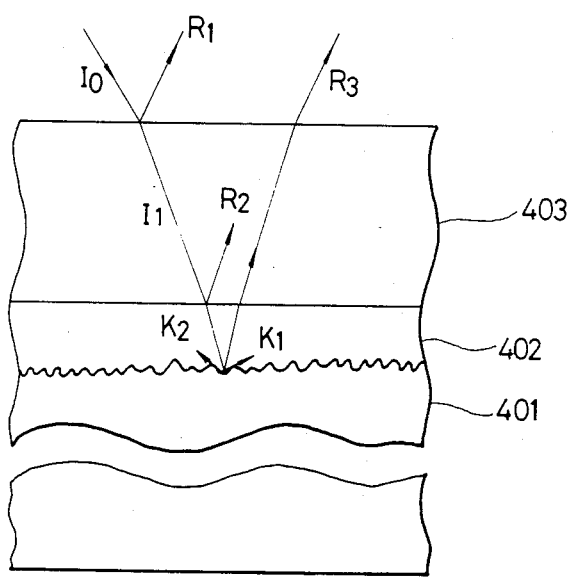
FIG. 4 is a schematic illustration of interference fringe by scattered light in the case of a multi-layer light receiving member.
Figure 5:
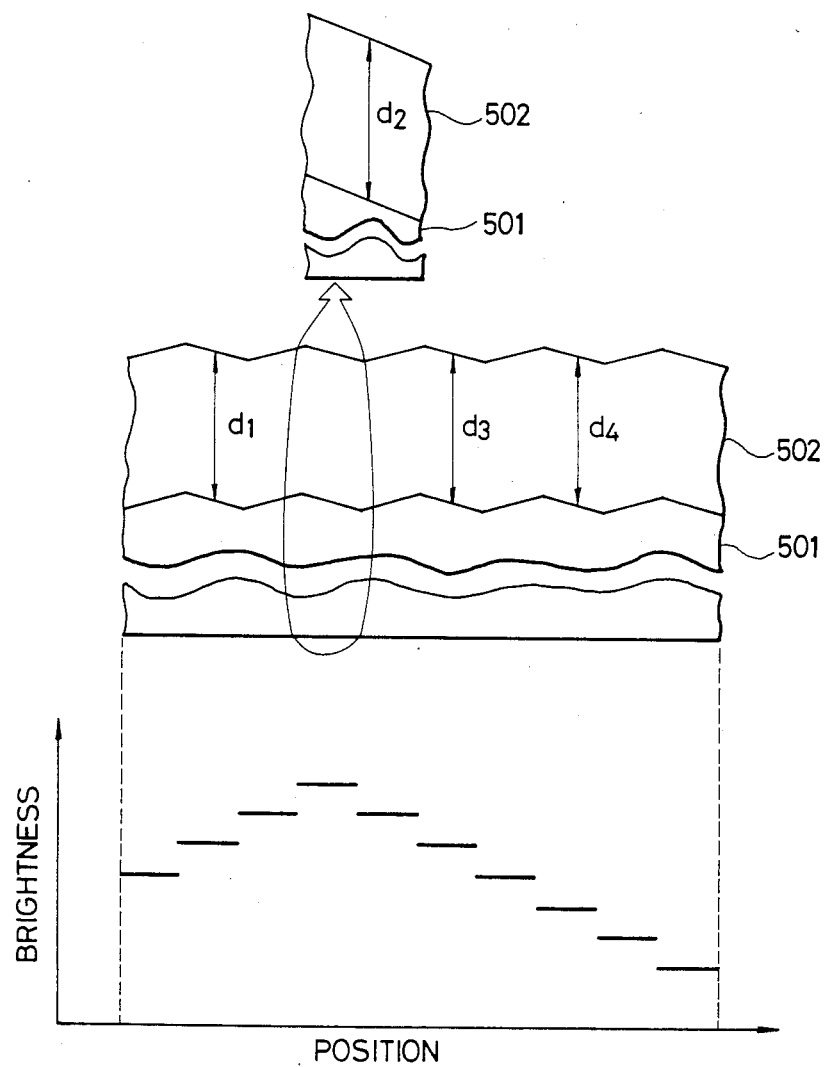
FIG. 5 is a schematic illustration of interference fringe in the case where the interfaces of respective layers of a light receiving member are parallel to each other.
Figure 6:
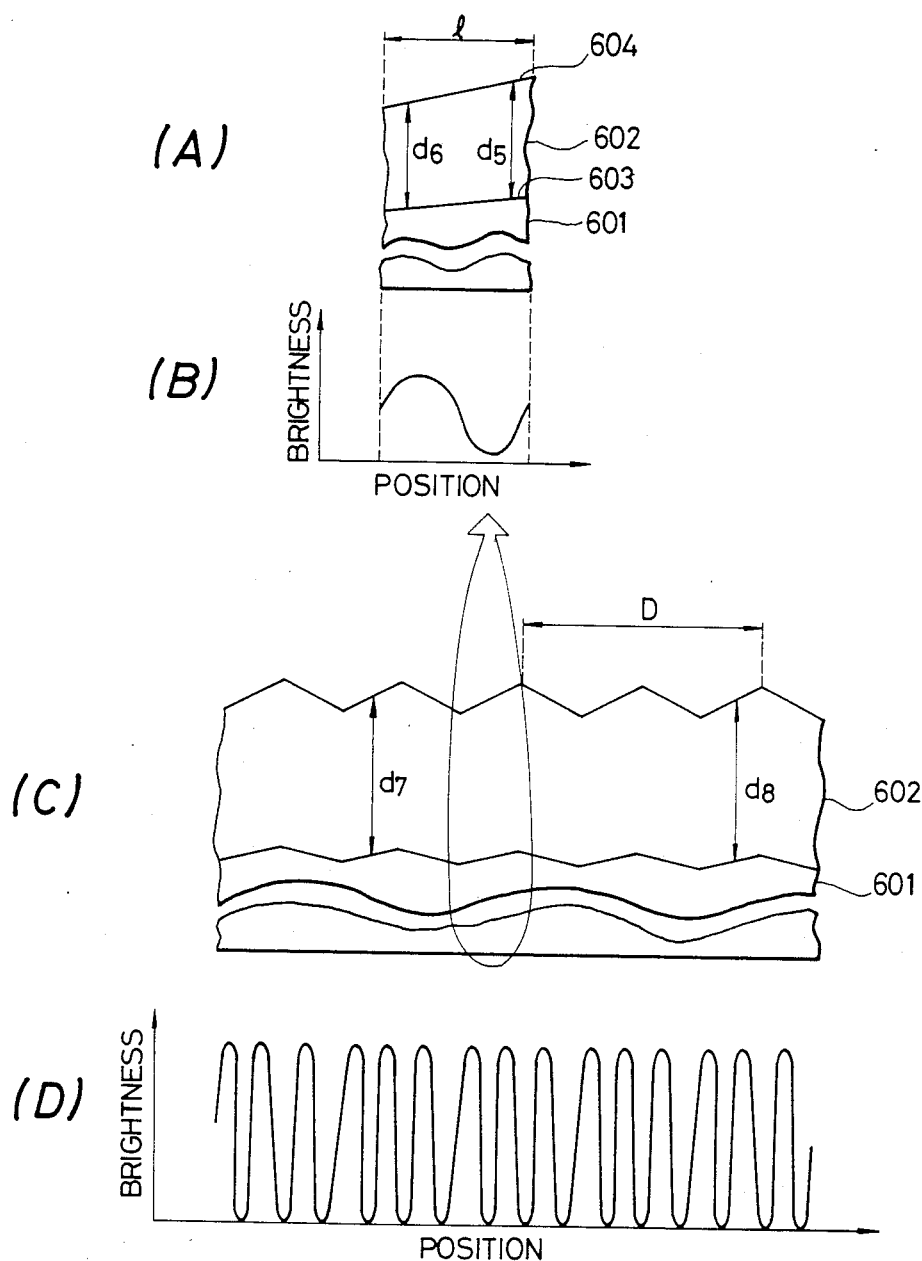
FIG. 6 is a schematic illustration for explaining no appearance of interference fringe in the case of non-parellel interfaces between respective layers of a light receiving member.

FIG. 6 is a schematic illustration for explanation of the basic principle of the present invention.

In the present invention, on a substrate having a fine uneven shape which is smaller than the resolution required for the device, a light receiving layer of a multi-layer constitution having at least one photosensitive layer is provided along the uneven slanted plane, with the thickness of the second layer 602 being continuously changed from $d_5$ to $d_6$, as shown in FIG. 6 on an enlarged scale, and therefore the interface 603 and the interface 604 have respective gradients. Accordingly, the coherent light incident on this minute portion (short range region) 1 [indicated schematically in FIG. 6 (C), and its enlarged view is shown in FIG. 6 (A)] undergoes interference at said minute portion 1 to form a minute interference fringe pattern.

Figure 7:
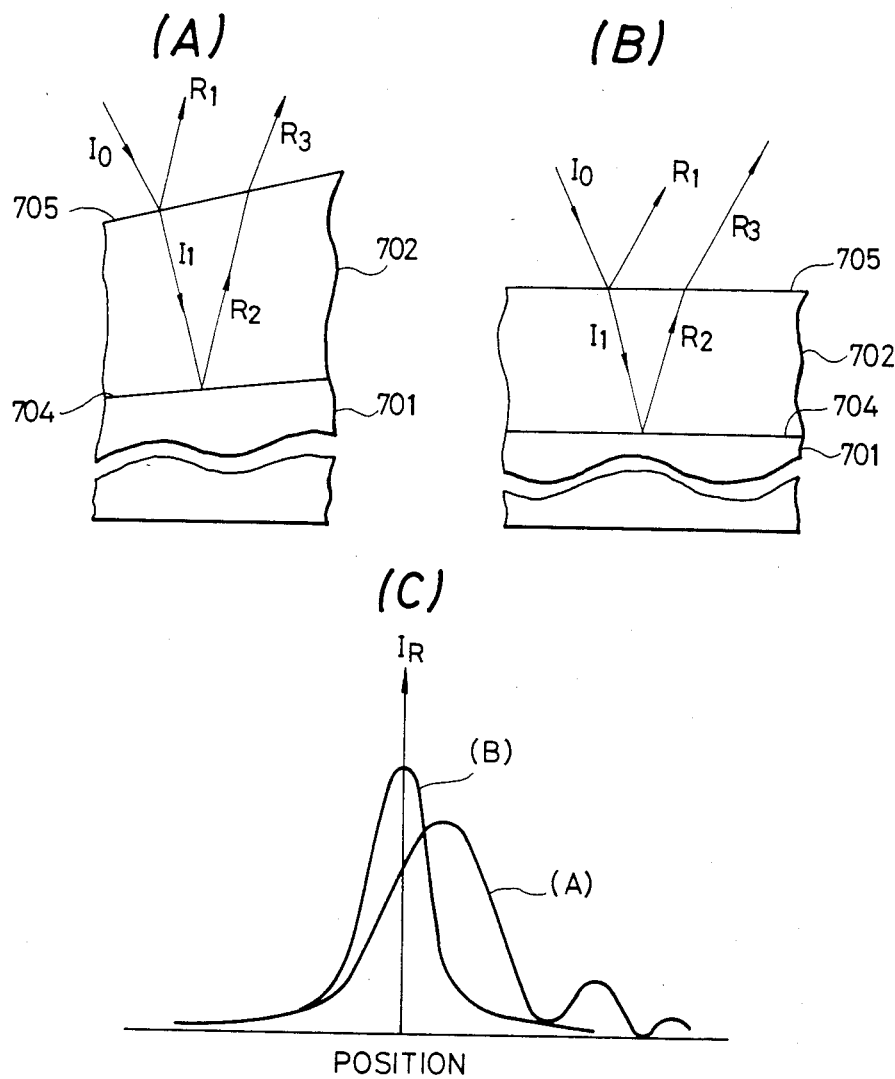
FIG. 7 is a schematic illustration for explaining comparison of the reflected light intensity between the case of parallel interfaces and non-parallel interfaces between the respective layers of a light receiving member.

Also, as shown in FIG. 7, when the interface 704 between the first layer 701 and the second layer 702 and the free surface 705 are non-parallel to each other, the reflected light $R_1$ and the emitted light $R_3$ for the incident light $I_0$ are different in direction of propagation from each other as shown in FIG. 7 (A), and therefore the degree of interference will be reduced as compared with the case when the interfaces 704 and 705 are parallel to each other (FIG. 7(B)).

Accordingly, as shown in FIG. 7 (C), as compared with the case "(B)" where a pair of the interfaces are in parallel relation, the difference in contrast of the interference fringe pattern becomes negligibly small even if interfered in the non-parallel case "(A)". Consequently, the quantity of the incident light in the minute portion is levelled off.

The same is the case, as shown in FIG. 6, even when the layer thickness of the layer 602 may be macroscopically nonuniform ($d_7 \neq d_8$), and therefore the incident light quantity becomes uniform all over the layer region (see FIG. 6 (D)).

Figure 8:
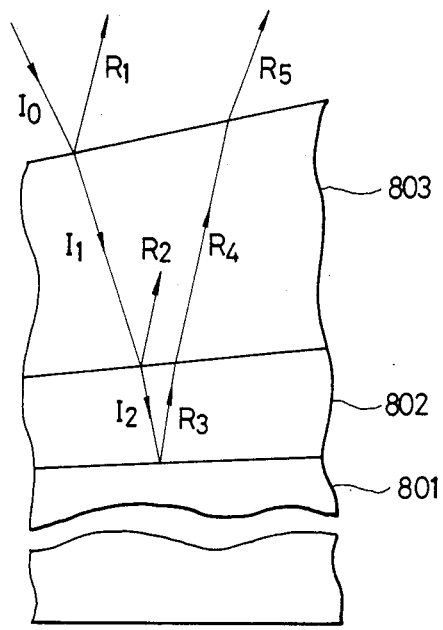
FIG. 8 is a schematic illustration for explaining no appearance of interference fringe in the case of non-parallel interfaces between respective layers.

To describe the effect of the present invention at the time when coherent light is transmitted from the irradiated side to the second layer in the case of a light receiving layer of a multi-layer structure, reflected lights $R_1$, $R_2$, $R_3$, $R_4$ and $R_5$ are produced for the incident light $I_0$, as shown in FIG. 8. Accordingly, at the respective layers, the same effect as described with reference to FIG. 7 occurs.

Therefore, when considered for the light receiving layer as a whole, interference occurs as a synergistic effect of the respective layers and, according to the present invention, appearance of interference can further be prevented as the number of layers constituting the light receiving layer is increased.

The interference fringe produced within the minute portion cannot appear on the image, because the size of the minute portion is smaller than the spot size of the irradiated light, namely smaller than the resolution limit. Further, even if appeared on the image, there is no problem at all, since it is less than resolving ability of the eyes.

In the present invention, the slanted plane of unevenness should desirably be mirror finished in order to direct the reflected light assuredly in one direction.

The size 1 (one cycle of uneven shape) of the minute portion suitable for the present invention should satisfy $l \leq L$, wherein L is the spot size of the incident light Further, in order to accomplish more effectively the objects of the present invention, the layer thickness difference ($d_5-d_6$) at the minute portion 1 should desirably be as follows:

$d_5-d_6 \geq \lambda/2n_1$ (where $\lambda$ is the wavelength of the incident light and $n_1$ is the refractive index of the second layer 602).

In the present invention, within the layer thickness of the minute portion 1 (hereinafter called as "minute column") in the light receiving layer of a multi-layer structure, the layer thicknesses of the respective layers are controlled so that at least two interfaces between layers may be in non-parallel relationship, and, provided that this condition is satisfied, any other pair of two interfaces may be in parallel relationship within said minute column.

However, it is desirable that the layers forming parallel interfaces should be formed to have uniform layer thicknesses so that the difference in layer thickness at any two positions may be not more than:

$\lambda/2n_2$ ($n_2$: refractive index of the layer concerned).

For formation of the respective layers such as photosensitive layer, charge injection preventive layer, barrier layer comprising an electrically insulating material which are selected as one of the layers constituting the multi-layer light receiving layer of the light receiving member of the present invention, in order to accomplish more effectively and easily the objects of the present invention, the plasma chemical vapor deposition method (PCVD method), the optical CVD method and thermal CVD method can be employed, because the layer thickness can accurately be controlled on the optical level thereby.

The unevenness to be provided on the substrate surface, in the case of a substrate such as metals which can be subjected to mechanical machining can be formed by fixing a bite having a V-shaped cutting blade at a predetermined position on a cutting working machine such as milling machine, lathe, etc, and by cut working accurately the substrate surface by, for example, moving regularly in a certain direction while rotating a cylindrical substrate according to a program previously designed as desired, thereby forming a desired unevenness shape, pitch and depth. The inverted-V-shaped linear projection produced by the unevenness formed by such a machining has a spiral structure with the center axis of the cylindrical substrate as its center. The spiral structure of the reverse-V-shaped projection may be made into a multiple spiral structure such as double or triple structure of a crossed spiral structure.

Alternatively, a straight line structure along the center axis may also be introduced in addition to the spiral structure.

Figure 9:
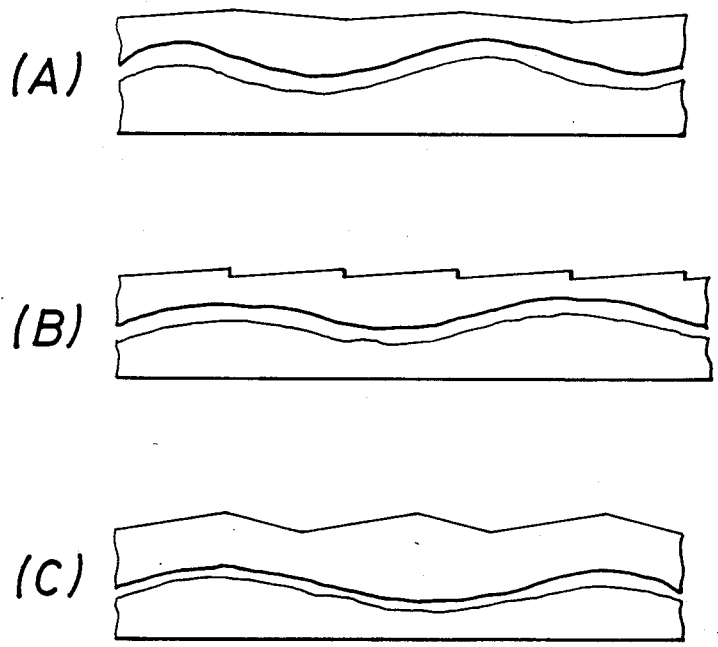
FIGS. 9 (A), (B) and (C) are each schematic illustrations of the surface condition of a typical substrate.

The shape of the longitudinal section of the protruded portion of the unevenness provided on the substrate surface is made reverse-V-shape in order to ensure controlled nonuniformity of layer thickness within minute columns of respective layers and good adhesion as well as desired electrical contact between the substrate and the layer provided directly on said substrate, and it should preferably be made an isosceles triangle (FIG. 9 (A)), a right angled triangle (FIG. 9 (B)) or a scalene triangle (FIG. 9 (C)). Of these shapes, an isosceles triangle and a right angled triangle are preferred.

In the present invention, the respective dimensions of the unevenness provided on the substrate surface under the controlled condition are set so as to accomplish consequently the objects of the present invention in view of the above points.

More specifically, in the first place, the A-Si layer constituting the photosensitive layer is sensitive to the structure of the surface on which the layer is formed, and the layer quality will be changed greatly depending on the surface condition. Accordingly, it is necessary to set dimensions of the unevenness to be provided on the substrate surface so that lowering in layer quality of the A-Si photosensitive layer may not be brought about.

Secondly, when there is an extreme unevenness on the free surface of the light receiving layer, cleaning cannot completely be performed in cleaning after image formation.

Further, in case of practicing blade cleaning, there is involved the problem that the blade will be damaged more earlier.

As the result of investigations of the problems in layer deposition as described above, problems in process of electrophotography and the conditions for prevention of interference fringe pattern, it has been found that the pitch at the recessed portion on the substrate surface should preferably be 0.3 μm to 500 μm, more preferably 1 to 200 μm, most preferably 5 μm to 50 μm.

It is also desirable that the maximum depth of the recessed portion should preferably be made 0.1 μm to 5 μm, more preferably 0.3 μm to 3 μm, most preferably 0.6 μm to 2 μm. When the pitch and the maximum depth of the recessed portions on the substrate surface are within the ranges as specified above, the gradient of the slanted plane at the recessed portion (or linear projection) may preferably be 1° to 20°, more preferably 3° to 15°, most preferably 4° to 10°.

On the other hand, the maximum of the layer thickness based on such nonuniformity in layer thickness of the respective layers formed on such a substrate should preferably be made 0.1 μm to 2 μm within the same pitch, more preferably 0.1 μm to 1.5 μm, most preferably 0.2 μm to 1 μm.

Referring now to a preferred embodiment, the light receiving member of the present invention having a multi-layer constitution is to be described.

Figure 10:
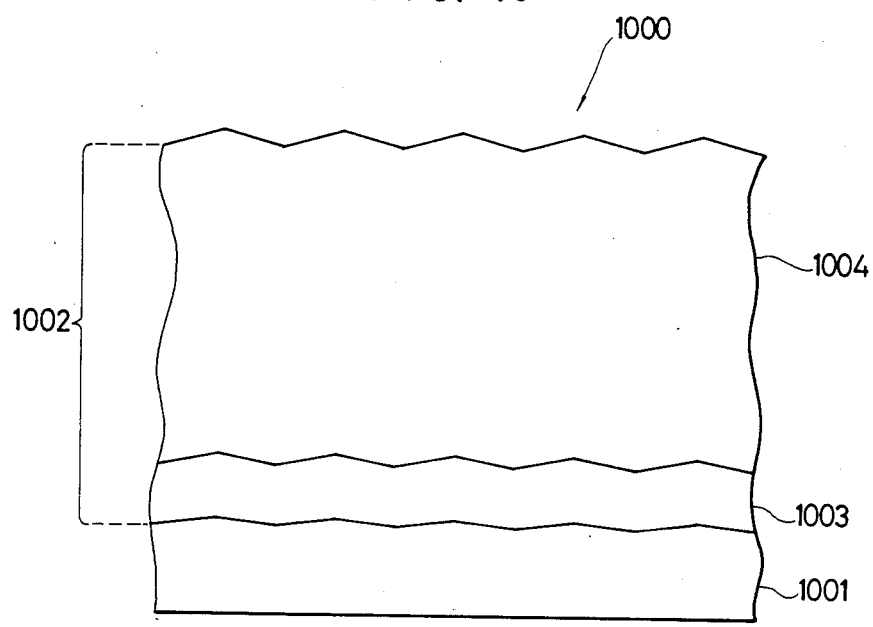
FIG. 10 is a schematic illustration of a light receiving member.

The light receiving member 1000 shown in FIG. 10 has a light receiving layer 1002 on a substrate 1001 which is subjected to surface cutting working so as to achieve the object of the invention, said light receiving layer being constituted of a charge injection preventive layer 1003 and a photosensitive layer 1004 from the side of the substrate 1001.

The substrate 1001 may be either electrically conductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. The surfaces thereof are subjected to the treatment for electric conduction, and it is desirable to provide other layers on the surface subjected to the treatment for electric condition.

For example, the treatment for electric conduction of a glass can be effected by providing a thin film of NiCr, Al, Cr, Mo, Au, Ir, Nb, Ta, V, Ti, Pt, Pd, $In_2O_3$, $SnO_2$, ITO ($IN_2O_3+SnO_2$) thereon. Alternatively, a synthetic resin film such as polyester film can be subjected to the treatment for electric conduction of its surface by vacuum vapor deposition, electron-beam deposition or sputtering of a metal such as NiCr, Al, Ag, Pd, Zn, NI, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light receiving member 1000 in FIG. 10 is to be used as an image forming member for electrophotography, it may desirably be formed into an endless belt or a cylinder for use in continuous high speed copying. The substrate may have a thickness, which is conveniently determined so that a light receiving member as desired may be formed. When the light receiving member is required to have a flexibility, the substrate is made as thin as possible, so far as the function of a substrate can be exhibited. However, in such a case, the thickness is generally 10 μm or more from the points of fabrication and handling of the substrate as well as its mechanical strength.

The charge injection preventive layer 1003 is provided for the purpose of preventing charges from the substrate 1001 side from being injected into the photosensitive layer, thereby increasing apparent resistance.

The charge injection preventive layer 1003 is constituted of A-Si containing hydrogen atoms and/or halogen atoms (X) (hereinafter written as "A-Si(H,X)" and also contains a substance (C) for controlling conductivity. As the substance (C) for controlling conductivity, there may be mentioned so-called impurities in the field of semiconductors. In the present invention, there may be included p-type impurities giving p-type conductivity characteristics and n-type impurities giving n-type conductivity characteristics to Si. More specifically, there may be mentioned as p-type impurities atoms belonging to the group III of the periodic table (Group III atoms), such as B (boron), Al (aluminum), Ga (gallium), In (indium), tl (thallium), etc., particularly preferably B and Ga. As n-type impurities, there may be included the atoms belonging to the group V of the periodic table (Group V atoms), such as P (phosphorus), As (arsenic), Sb (antimony), Bi (bismuth), etc., particularly preferably P and As.

In the present invention, the content of the substance (C) for controlling conductivity contained in the charge injection preventing layer 1003 may be suitably be determined depending on the charge injection preventing characteristic required, or on the organic relationship such as relation with the characteristic at the contacted interface with said substrate 1001 when said charge injection preventive layer 1003 is provided on the substrate 1001 in direct contact therewith. Also, the content of the substance (C) for controlling conductivity is determined suitably with due considerations of the relationships with characteristics of other layer regions provided in direct contact with the above charge injection preventive layer or the characteristics at the contacted interface with said other layer regions.

In the present invention, the content of the substance (C) for controlling conductivity contained in the charge injection preventive layer 1003 should preferably be 0.001 to $5 \times 10^4$ atomic ppm, more preferably 0.5 to $1 \times 10^4$ atomic ppm, most preferably 1 to $5 \times 10^3$ atomic ppm.

In the present invention, by making the content of the substance (C) in the charge injection preventive layer 1003 preferably 30 atomic ppm or more, more preferably 50 atomic ppm or more, most preferably 100 atomic ppm or more, for example, in the case when said substance (C) to be incorporated is a p-type impurity mentioned above, migration of electrons injected from the substrate 1001 side into the photosensitive layer 1004 can be effectively inhibited when the free surface of the light receiving layer 1002 is subjected to the charging treatment to $\oplus$ polarity. On the other hand, when the substance (C) to be incorporated is a n-type impurity as mentioned above, migration of positive holes injected from the substrate 1001 side into the photosensitive layer 1004 can be more effectively inhibited when the free surface of the light receiving layer 1002 is subjected to the charging treatment to $\ominus$ polarity.

The charge injection preventive layer 1003 may have a thickness preferably of 30 Å to 10μ, more preferably of 40 Å to 8μ, most preferably of 50 Å to 5μ.

The photosensitive layer 1004 is constituted of A-Si (H,X) and has both the charge generating function to generate photocarriers by irradiation with a laser beam and the charge transporting function to transport said charges.

The photosensitive layer 1004 may have a thickness preferably of 1 to 100 μm more preferably of 1 to 80μ, most preferably of 2 to 50μ.

The photosensitive layer 1004 may contain a substance for controlling conductivity of the other polarity than that of the substance for controlling conductivity contained in the charge injection preventive layer 1003, or a substance for controlling conductivity of the same polarity may be contained therein in an amount by far smaller than that practically contained in the charge injection preventive layer 1003.

In such a case, the content of the substance for controlling conductivity contained in the above photosensitive layer 1004 can be determined adequately as desired depending on the polarity or the content of the substance contained in the charge injection preventive layer, but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the charge injection preventive layer 1003 and the photosensitive layer 1004, the content of the substance in the photosensitive layer 1004 should preferably be 30 atomic ppm or less.

In the present invention, the amount of hydrogen atoms (H) or the amount of halogen atoms (X) or the sum of the amounts of hydrogen atoms and halogen atoms (H+X) to be contained in the charge injection preventive layer 1003 and the photosensitive layer 1004 should preferably be 1 to 40 atomic %, more preferably 5 to 30 atomic %.

As halogen atoms (X), F, Cl, Br and I may be included and among them, F and Cl may preferably be employed.

In the light receiving member shown in FIG. 10, a so-called barrier layer comprising an electrically insulating material may be provided in place of the charge injection preventive layer 1003. Alternatively, it is also possible to use said barrier layer in combination with the charge injection preventive layer 1003.

As the material for forming the barrier layer, there may be included inorganic insulating materials such as $Al_2O_3$, $SiO_2$, $Si_3N_4$, etc. or organic insulating materials such as polycarbonate, etc.

In the light receiving member of the present invention, for the purpose of making higher photosensitivity and dark resistance, and further for the purpose of improving adhesion between the substrate and the light receiving layer, at least one kind of atoms selected from oxygen atoms, carbon atoms and nitrogen atoms are contained. Such atoms (OCN) to be contained in the light receiving layer may be contained therein throughout the whole layer region or localized by being contained in a part of the layer region of the light receiving layer.

The distribution state of oxygen atoms within the layer region containing oxygen atoms may be such that the distribution concentration C (OCN) may be either uniform or ununiform in the layer thickness direction of the light receiving layer, but it should desirably be uniform within the plane parallel to the surface of the substrate.

In the present invention, the layer region (OCN) in which atoms (OCN) are contained is provided so as to occupy the whole layer region of the light receiving layer when it is primarily intended to improve photosensitivity and dark resistance, while it is provided so as to occupy the end portion layer region on the substrate side of the light receiving layer when it is primarily intended to strengthen adhesion between the substrate and the light receiving layer.

In the former case, the content of atoms (OCN) contained in the layer region (OCN) should desirably be made relatively smaller in order to maintain high photosensitivity, while in the latter case relatively larger in order to ensure reinforcement of adhesion to the substrate.

In the present invention, the content of the atoms (OCN) to be contained in the layer region (OCN) provided in the light receiving layer can be selected suitably in organic relationship with the characteristics required for the layer region (OCN) itself, or with the characteristic at the contacted interface with the substrate when the said layer region (OCN) is provided in direct contact with the substrate, etc.

When other layer regions are to be provided in direct contact with the layer region (OCN), the content of the atoms (OCN) may suitalbly be selected with due consideration about the characteristics of said other layer regions or the characteristics at the contacted interface with said other layer regions.

The amount of the atoms (OCN) contained in the layer region (OCN) may be determined as desired depending on the characteristics required for the light receiving member to be formed, but it may preferably be 0.001 to 50 atomic %, more preferably 0.002 to 40 atomic %, most preferably 0.003 to 30 atomic %.

In the present invention, when the layer region (OCN) occupies the whole region of the light receiving layer or, although not occupying the whole region, the proportion of the layer thickness $T_0$ of the layer region (OCN) occupied in the layer thickness T of the light receiving layer is sufficiently large, the upper limit of the content of the atoms (OCN) contained in the layer region (OCN) should desirably be made sufficiently smaller than the value as specified above.

In the case of the present invention, when the proportion of the layer thickness $T_0$ of the layer region (OCN) occupied relative to the layer thickness T of the light receiving layer is 2/5 or higher, the upper limit of the content of the atoms (OCN) contained in the layer region (OCN) should desirably be made 30 atomic % or less, more preferably 20 atomic % or less, most preferably 10 atomic % or less.

According to a preferred embodiment of the present invention, it is desirable that the atoms (OCN) should be contained in at least the above charge injection preventive layer and the barrier layer provided directly on the substrate. In short, by incorporating the atoms (OCN) at the end portion layer region on the substrate side in the light receiving layer, it is possible to effect reinforcement of adhesion between the substrate and the light receiving layer.

Further, in the case of nitrogen atoms, for example, under the co-presence of boron atoms, improvement of dark resistance and improvement of photosensitivity can further be ensured, and therefore they should preferably be contained in a desired amount in the light receiving layer.

Plural kinds of these atoms (OCN) may also be contained in the light receiving layer. For example, oxygen atoms may be contained in the charge injection preventive layer, nitrogen atoms in the photosensitive layer, or alternatively oxygen atoms and nitrogen atoms may be permitted to be co-present in the same layer region.

FIGS. 16 through 24 show typical examples of ununiform depth profiles in the layer thickness direction of the atoms (OCN) contained in the layer region (OCN) in the light receiving member of the present invention.

In FIGS. 16 through 24, the abscissa indicates the distributed concentration C of the atoms (OCN), and the ordinate the layer thickness of the layer region (OCN), $t_B$ showing the position of the end face of the layer region (OCN) on the substrate side, while $t_T$ shows the position of the other end face of the layer region (OCN) opposite to the substrate side. Thus, layer formation of the layer region (OCN) containing the atoms (OCN) proceeds from the $t_B$ side toward the $t_T$ side.

Figure 16:
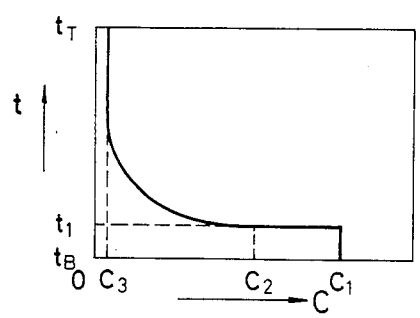
FIGS. 16 through 24 are each schematic illustrations of the depth profile of the atoms (OCN) in the layer region (OCN)

FIG. 16 shows the first typical embodiment of the depth profile in the layer thickness direction of the atoms (OCN) contained in the layer region (OCN).

In the embodiment shown in FIG. 16, from the interface position $t_B$ where the surface on which the layer region (OCN) containing the atoms (OCN) is formed contacts the surface of said layer region (OCN) to the position of $t_1$, the atoms (OCN) are contained in the layer region (OCN) to be formed while the distribution concentration of the atoms (OCN) taking a constant value of $C_1$, said distribution concentration being gradually continuously reduced from $C_2$ from the position $t_1$ to the interface position $t_T$, until at the interface position $t_T$, the distribution concentration C is made $C_3$.

Figure 17:
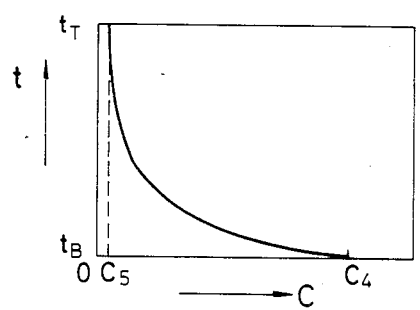

In the embodiment shown in FIG. 17, the distribution concentration C of the atoms (OCN) contained is reduced gradually continuously from the concentration $C_4$ from the position $t_B$ to the position $t_T$, at which it becomes the concentration $C_5$.

Figure 18:
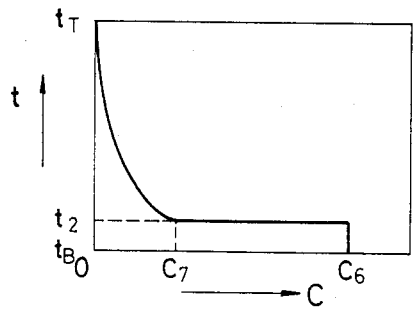

In the case of FIG. 18, from the position $t_B$ to the position $t_2$, the distribution concentration of the atoms (OCN) is made constantly at $C_6$, reduced gradually continuously between the position $t_2$ and the position $t_T$, until at the position $t_T$, the distribution concentration C is made substantially zero (herein substantially zero means the case of less than the detectable level).

Figure 19:
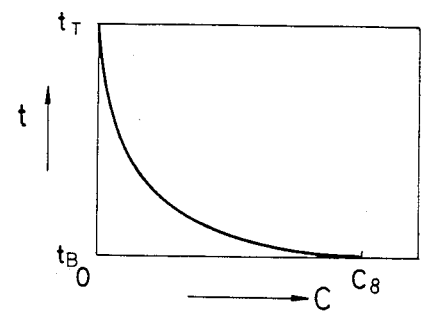

In the case of FIG. 19, the distribution concentration C of the atoms (OCN) is reduced gradually continuously from the concentration $C_8$ from the position $t_B$ up to the position $t_T$, to be made substantially zero at the position $t_T$.

Figure 20:
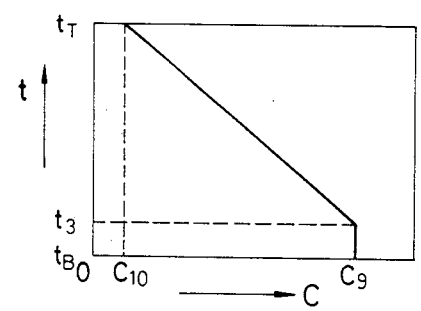

In the embodiment shown in FIG. 20, the distribution concentration C of the atoms (OCN) is made constantly $C_9$ between the position $t_B$ and the position $t_3$, and it is made the concentration $C_{10}$ at the position $t_T$. Between the position $t_3$ and the position $t_T$, the distribution concentration C is reduced as the first order function.

Figure 21:
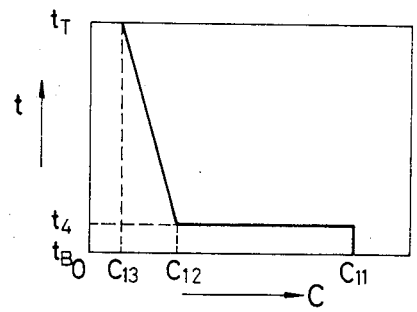

In the embodiment shown in FIG. 21, from the position $t_B$ to the position $t_4$, the distribution concentration C takes a constant value of $C_{11}$, while the distribution state is changed to the first order function in which the concentration is decreased from the concentration $C_{12}$ to the concentration $C_{13}$ from the position $t_4$ to the position $t_T$.

Figure 22:
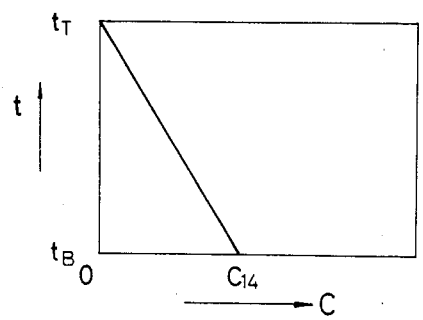

In the embodiment shown in FIG. 22, from the position $t_B$ to the position $t_T$, the distribution concentration C of the atoms (OCN) is reduced as the first order function from the concentration $C_{14}$ to substantially zero.

Figure 23:
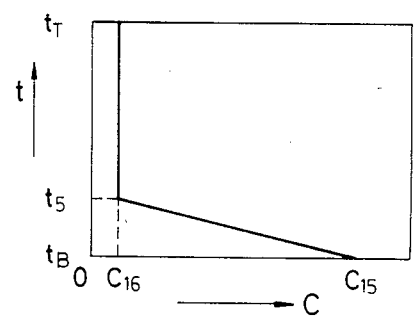

In FIG. 23, there is shown an embodiment, wherein from the position $t_B$ to the position $t_5$, the distribution concentration of the atoms (OCN) is reduced as the first order function from the concentration $C_{15}$ to $C_{16}$, and it is made constantly $C_{16}$ between the position $t_5$ and the position $t_T$.

Figure 24:
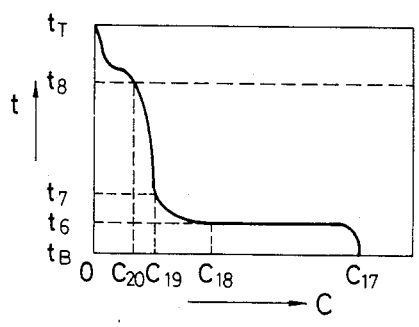

In the embodiment shown in FIG. 24, the distribution concentration C of the atoms (OCN) is $C_{17}$ at the position $t_B$ and, toward the position $t_6$, this $C_{17}$ is initially reduced gradually and then abruptly reduced near the position $t_6$, until it is made the concentration $C_{18}$ at the position $t_6$.

Between the position $t_6$ and the position $t_7$, the concentration is initially reduced abruptly and thereafter gently gradually reduced to become $C_{19}$ at the position $t_7$, and between the position $t_7$ and the position $t_8$, it is reduced gradually very slowly to become $C_{20}$ at the position $t_8$. Between the position $t_8$ and the position $t_T$, the concentration is reduced from the concentration $C_{20}$ to substantially zero along a curve with a shape as shown in the Figure.

As described above about some typical examples of depth profiles in the layer thickness direction of the atoms (OCN) contained in the layer region (OCN) by referring to FIGS. 16 through 24, it is desirable in the present invention that, when the atoms (OCN) are to be contained ununiformly in the layer region (OCN), the atoms (OCN) should be distributed in the layer region (OCN) with higher concentration on the substrate side, while having a portion in which the concentration is considerably reduced on the interface $t_T$ side as compared with the substrate side.

The layer region (OCN) containing atoms (OCN) should desirably be provided so as to have a localized region (B) containing the atoms (OCN) at a relatively higher concentration on the substrate side as described above, and in this case, adhesion between the substrate and the light receiving layer can be further improved.

The above localized region (B) should desirably be provided within $5\mu$ from the interface position $t_B$, as explained in terms of the symbols indicated in FIGS. 16 through 24.

In the present invention, the above localized region (B) may occupy all or part of the layer region ($L_T$) which is within $5\mu$ from the interface position $t_B$.

It may suitably be determined depending on the characteristics required for the light receiving layer to be formed whether the localized region (B) is made a part or whole of the layer region ($L_T$).

The localized region (B) should preferably be formed to have a depth profile in the layer thickness direction such that the maximum value Cmax of the distribution concentration of the atoms (OCN) may preferably be 500 atomic ppm or more, more preferably 800 atomic ppm or more, most preferably 1000 atomic ppm or more.

In other words, in the present invention, the layer region (OCN) containing the atoms (OCN) should preferably be formed so that the maximum value Cmax of the distribution concentration C may exist within $5\mu$ layer thickness from the substrate side (layer region with $5\mu$ thickness from $t_B$).

In the present invention, when the layer region (OCN) is provided so as to occupy part of the layer region of the light receiving layer, the depth profile of the atoms (OCN) should desirably be formed so that the refractive index may be changed moderately at the interface between the layer region (OCN) and other layer regions.

By doing so, reflection of the light incident upon the light receiving layer from the interfaces between layers can be inhibited, whereby appearance of interference fringe pattern can more effectively be prevented.

It is also preferred that the distribution concentration C of the atoms (OCN) in the layer region (OCN) should be changed along a line which is changed continuously and moderately, in order to give smooth refractive index change.

In this regard, it is preferred that the atoms (OCN) should be contained in the layer region (OCN) so that the depth profile as shown in FIGS. 16 through 19, FIG. 22 and FIG. 24 may be assumed.

In the present invention, formation of a photosensitive layer constituted of A-Si containing hydrogen atoms and/or halogen atoms (written as "A-Si(H,X)") may be conducted according to the vacuum deposition method utilizing discharging phenomenon, such as glow discharge method, sputtering method or ion-plating method. For example, for formation of a photosensitive layer constituted of a-Si (H, X) according to the glow discharge method, the basic procedure comprises introducing a starting gas for Si supply capable of supplying silicon atoms, optionally together with a starting gas for introduction of hydrogen atoms (H) and/or a starting gas for introduction of halogen atoms (X), into a deposition chamber which can be brought internally to a reduced pressure and exciting glow discharge in said deposition chamber, thereby forming a layer comprising a-Si(H,X) on a desired substrate placed at a predetermined position. Alternatively, for formation according to the sputtering method, gases for introduction of hydrogen atoms (H) and/or halogen atoms (X), which may optionally be diluted with a diluting gas such as He, Ar, etc., may be introduced into a deposition chamber to form a desired gas plasma atmosphere when effecting sputtering of a target constituted of Si in an inert gas such as Ar, He, etc. or a gas mixture based on these gases.

In the case of the ion-plating method, for example, a vaporizing source such as a polycrystalline silicon or a single crystalline silicon may be placed in a evaporating boat, and the vaporizing source is heated by the resistance heating method or the electron beam method (EB method) to be vaporized, and the flying vaporized product is permitted to pass through a desired gas plasma atmosphere, otherwise following the same procedure as in the case of sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ as effective materials. In particular, $SiH_4$ and $Si_2H_6$ are preferred with respect to easy handling during layer formation and efficiency for supplying Si.

Effective starting gases for introduction of halogen atoms to be used in the present invention may include a large number of halogenic compounds, as exemplified preferably by halogen gases, halides, interhalogen compound, or gaseous or gasifiable halogenic compounds such as silane derivatives substituted with halogens. Further, there may also be included gaseous or gasifiable hydrogenated silicon compounds containing silicon atoms and halogen atoms as constituent elements as effective ones in the present invention.

Typical examples of halogen compounds preferably used in the present invention may include halogen gases such as fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen compound, namely so-called silane derivatives substituted with halogens, there may preferably be employed silicon halides such as $SiF_4$, $Si_2F_6$, $SiCl_4$, $SiBr_4$ and the like.

When the characteristic light receiving member of the present invention is formed according to the glow discharge method by employment of such a silicon compound containing halogen atoms, it is possible to form the photosensitive layer comprising A-Si containing halogen atoms on a desired substrate without use of a hydrogenated silicon gas as the starting gas capable of supplying Si.

In the case of forming the photosensitive layer containing halogen atoms according to the glow discharge method, the basic procedure comprised, for example, introducing a silicon halide as the starting gas for Si supply and a gas such as Ar, $H_2$, He, etc. at a predetermined mixing ratio into the deposition chamber for formation of the photosensitive layer and exciting glow discharge to form a plasma atmosphere of these gases, whereby the photosensitive layer can be formed on a desired substrate. In order to control the ratio of hydrogen atoms incorporated more easily, hydrogen gas, or a gas of a silicon compound containing hydrogen atoms may also be mixed with these gases in a desired amount to form the layer.

Also, each gas is not restricted to a single species, but multiple species may be available at any desired ratio.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes may be introduced into a deposition chamber for sputtering, followed by formation of the plasma atmosphere of these gases.

In the present invention, as the starting gas for introduction of halogen atoms, the halides or halo-containing silicon compounds as mentioned above can be effectively used. Otherwise, it is also possible to use effectively as the starting material for formation of the photosensitive layer gaseous or gasifiable substances, including hydrogen halides such as HF, HCl, HBr, HI, etc.; halo-substituted hydrogenated silicon such as $SiH_2F_2$, $SiH_2I_2$, $SiH_2Cl_2$, $SiHCl_3$, $SiH_2Br_2$, $SiHBr_2$, $SiHBr_3$, etc.

Among these substances, halides containing hydrogen atoms can preferably be used as the starting material for introduction of halogens, because hydrogen atoms, which are very effective for controlling electrical or photoelectric characteristics, can be introduced into the layer simultaneously with introduction of halogen atoms during formation of the photosensitive layer.

For introducing the substance (C) for controlling conductivity, for example, the group III atoms or the group V atoms structurally into the charge injection preventive layer or the photosensitive layer constituting the light receiving layer, the starting material for introduction of the group III atoms or the starting material for introduction of the group V atoms may be introduced under gaseous state into a deposition chamber together with other starting materials for formation of the light receiving layer. As the material which can be used as such starting materials for introduction of the group III atoms or the group V atoms, there may be desirably employed those which are gaseous under the conditions of normal temperature and normal pressure, or at least readily gasifiable under layer forming conditions. Examples of such starting materials for introduction of the group III atoms include boron hydrides such as $B_2H_6$, $B_4H_{10}$, $B_5H_9$, $B_5H_{11}$, $B_6H_{10}$, $B_6H_{12}$, $B_6H_{14}$ and the like, boron halides such as $BF_3$, $BCl_3$, $BBr_3$ and the like. In addition, there may also be included $AlCl_3$, $GaCl_3$, $Ga(CH_3)_3$, $InCl_3$, $TlCl_3$ and the like.

Examples of the starting materials for introduction of the group V atoms are phosphorus hydrides such as $PH_3$, $P_2H_4$ and the like, phosphorus halides such as $PH_4I$, $PF_3$, $PF_5$, $PCl_3$, $PCl_5$, $PBr_3$, $PBr_5$, $PI_3$ and the like. In addition, there may also be included $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like, as effective materials for introduction of the group V atoms.

In the present invention, for provision of a layer region (OCN) containing the atoms (OCN) in the light receiving layer, a starting material for introduction of the atoms (OCN) may be used together with the starting material for formation of the light receiving layer during formation of the light receiving layer and incorporated in the layer formed while controlling its amount.

When the glow discharge method is employed for formation of the layer region (OCN), a starting material for introduction of the atoms (OCN) is added to the material selected as desired from the starting materials for formation of the light receiving layer as described above. For such a starting material for introduction of the atoms (OCN), there may be employed most of gaseous or gasified gasifiable substances containing at least the atoms (OCN) as the constituent atoms.

More specifically, there may be included, for example, oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$); lower siloxanes containing silicon atom (Si), oxygen atoms (O) and hydrogen atom (H) as constituent atoms, such as disiloxane ($H_3SiOSiH_3$), trisiloxane ($H_3SiOSiH_2OSiH_3$), and the like; saturated hydrocarbons having 1-5 carbon atoms such as methane ($CH_4$), ethane ($C_2H_6$), propane ($C_3H_8$), n-butane (n—$C_4H_{10}$), pentane ($C_5H_{12}$); ethylenic hydrocarbons having 2-5 carbon atoms such as ethylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons having 2-4 carbon atoms such as acetylene ($C_2H_2$), methyl acetylene ($C_3H_4$), butyne ($C_4H_6$); and the like; nitrogen ($N_2$), ammonia ($NH_3$), hydrazine ($H_2NNH_2$), hydrogen azide ($HN_3$), ammonium azide ($NH_4N_3$), nitrogen trifluoride ($F_3N$), nitrogen tetrafluoride ($F_4N$) and so on.

In the case of the sputtering method, as the starting material for introduction of the atoms (OCN), there may also be employed solid starting materials such as $SiO_2$, $Si_3N_4$ and carbon black in addition to those gasifiable as enumerated above for the glow discharge method. These can be used in the form of a target for sputtering together with the target of Si, etc.

In the present invention, when forming a layer region (OCN) containing the atoms (OCN) during formation of the light receiving layer, formation of the layer region (OCN) having a desired depth profile of the atoms (OCN) in the direction of layer thickness formed by varying the distribution concentration C of the atoms (OCN) contained in said layer region (OCN) may be conducted in the case of glow discharge by introducing a starting gas for introduction of the atoms (OCN), the distribution concentration C of which is to be varied into a deposition chamber, while varying suitably its gas flow rate according to a desired rate of change curve.

For example, by the manual method or any other method conventionally used such as an externally driven motor, etc., the opening of certain needle valve provided in the course of the gas flow channel system may be gradually varied. During this operation, the rate of variation is not necessarily required to be linear, but the flow rate may be controlled according to a rate of change curve previously designed by means of, for example, a microcomputer to give a desired content curve.

When the layer region (OCN) is formed according to the sputtering method, formation of a desired depth profile of the atoms (OCN) in the layer thickness direction by varying the distribution concentration C or the atoms (OCN) may be performed first similarly as in the case of the glow discharge method by employing a starting material for introduction of the atoms (OCN) under gaseous state and varying suitably as desired the gas flow rate of said gas when introduced in to the deposition chamber. Secondly, formation of such a depth provile can also be achieved by previously changing the composition of a target for sputtering. For example, when a target comprising a mixture of Si and $SiO_2$ is to be used, the mixing ratio of Si to $SiO_2$ may be varied in the direction of layer thickness of the target.

The present invention is described by referring to the following examples.

EXAMPLE 1

Figure 11:
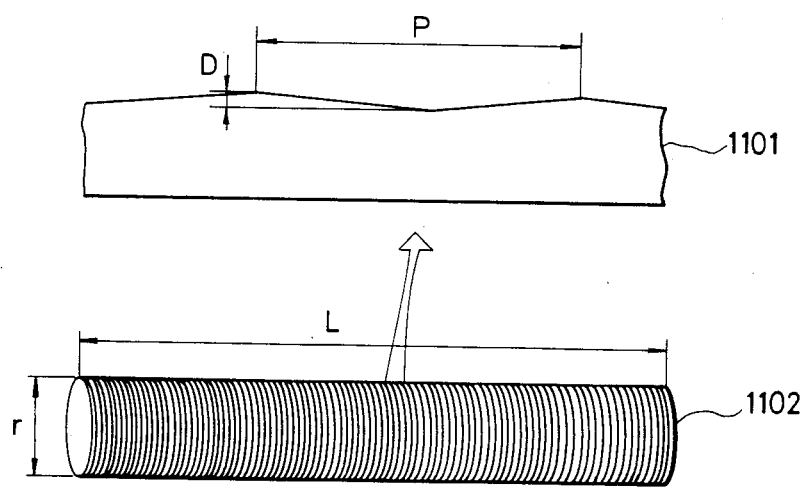
FIG. 11 is a schematic illustration of the surface condition of the aluminum substrate employed in Example 1.

In this Example, a semiconductor laser (wavelength: 780 nm) with a spot size of 80 $\mu$m was employed. Thus, on a cylindrical aluminum substrate (length (L) 357 mm, outer diameter (r) 80 mm) on which A-Si:H is to be deposited, a spiral groove was prepared by a lathe with a pitch (P) of 25 $\mu$m and a depth (D) of 0.8 S. The form of the groove is shown in FIG. 11.

Figure 12:
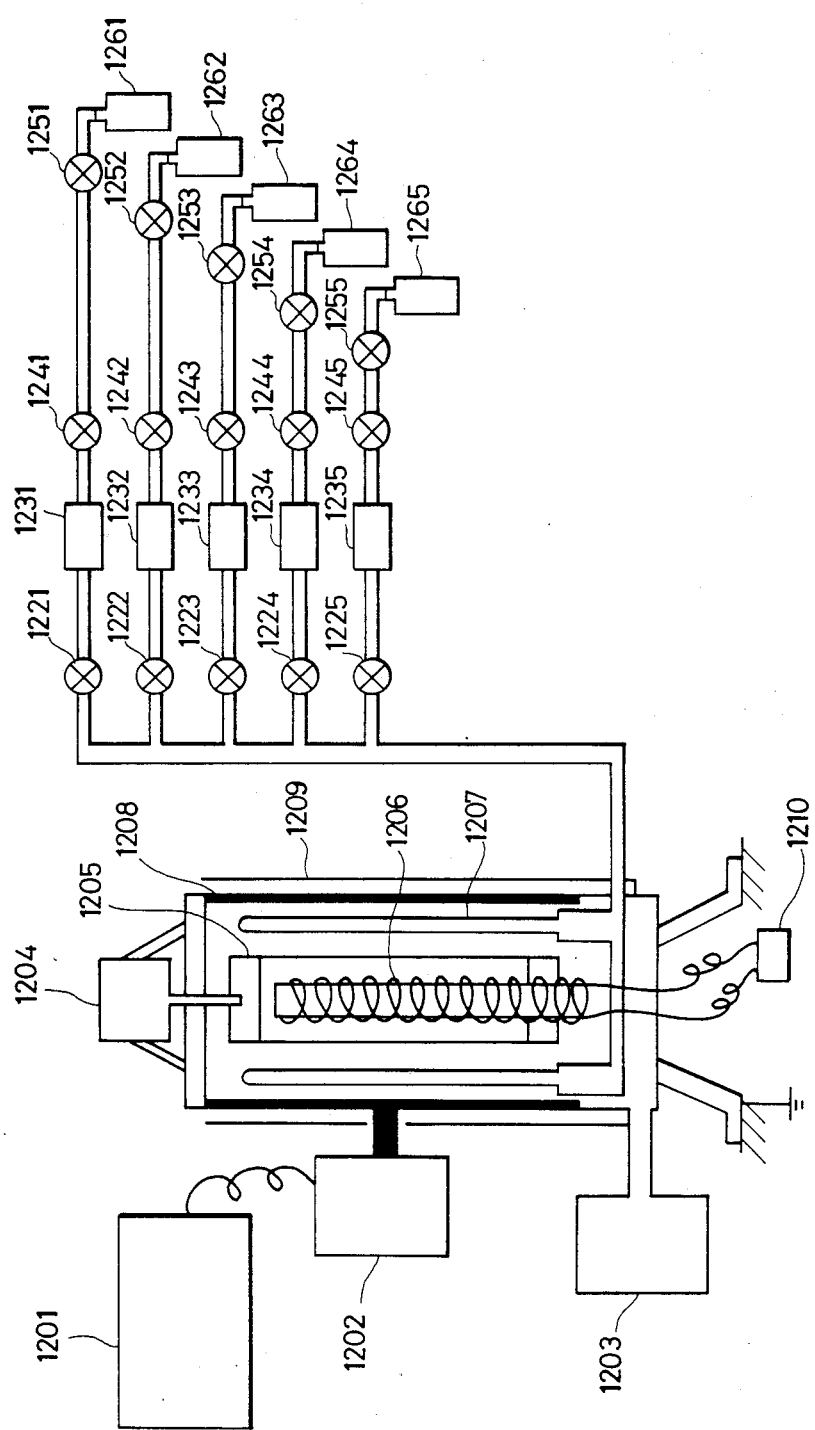
FIG. 12 is a schematic illustration of a device for deposition of light receiving layer employed in Examples.

On this aluminum substrate, the charge injection preventive layer and the photosensitive layer were deposited by means of the device as shown in FIG. 12 in the following manner.

First, the constitution of the device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1206 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen ($H_2$) bomb, 1262 is a silane ($SiH_4$) bomb, 1263 is a diborane ($B_2H_6$) bomb, 1264 is a nitrogen monoxide (NO) bomb and 1267 is a methane ($CH_4$) bomb.

Next, the preparation procedure is to be explained. All of the main cocks of the bombs 1261–1265 were closed, all the mass flow controllers and the valves were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the temperature of the aluminum substrate 1205 became constantly at 250° C., the valves 1221–1225, 1241–1245 and 1251–1255 were closed, the main cocks of bombs 1261–1265 were opened and the diffusion pump 1203 was changed to the mechanical booster pump. The secondary pressure of the valves equipped with regulators 1251–1255 was set at 1.5 Kg/cm². The mass flow controller 1231 was set at 300 SCCM, and the valves 1241 and 1221 were successively opened to introduce $H_2$ gas in bomb 1261 into the deposition device.

Next, by setting the mass flow controller 1232 at 150 SCCM, $SiH_4$ gas in bomb 1262 was introduced into the deposition device according to the same procedure as introduction of $H_2$ gas. Then, by setting the mass flow controller 1233 so that the flow rate of $B_2H_6$ gas may be 1600 Vol. ppm relative to $SiH_4$ gas flow rate, $B_2H_6$ gas was introduced into the deposition device according to the same procedure as introduction of $H_2$ gas.

When the inner pressure in the deposition device was stabilized at 0.2 Torr, the high frequency power source 1201 was turned on and glow discharge was generated between the aluminum substrate 1205 and the cathode electrode 1208 by controlling the matching box 1202, and a A-Si:H layer (p-type A-Si:H layer containing B) was deposited to a thickness of 5 $\mu$m at a high frequency power of 150 W (charge injection preventive layer). After deposition of a 5 $\mu$m thick A-Si:H layer (p-type), inflow of $B_2H_6$ was stopped by closing the valve 1223 without discontinuing discharge.

And, A-Si:H layer (non-doped) with a thickness of 20 $\mu$m was deposited at a high frequency power of 150 W (photosensitive layer). Then, with the high frequency power source and all the valves being closed, the deposition device was evacuated, the temperature of the aluminum substrate was lowered to room temperature and the substrate on which the light receiving layer was formed was taken out.

Figure 13:
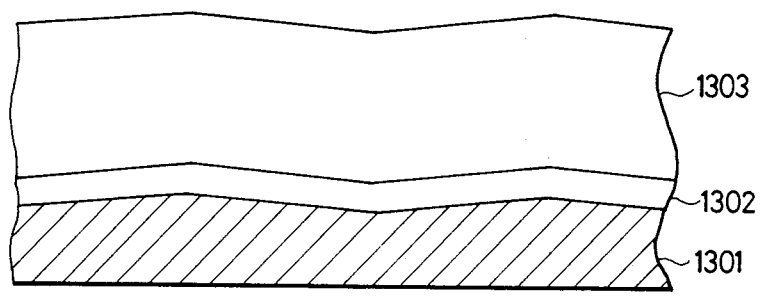
FIG. 13 and FIG. 14 are each schematic illustrations for explaining the structures of the light receiving members prepared in Example 1.

Separately, when a charge injection preventive layer and a photosensitive layer were formed on the same cylindrical aluminum substrate with the same surface characteristic under the same conditions and according to the same procedure as in the above case except for changing the high frequency power to 50 W, the surface of the photosensitive layer 1303 was found to be parallel to the surface of the substrate 1301, as shown in FIG. 13. The difference in the total layer thickness between the center and the both end portions of the aluminum substrate was 1 $\mu$m.

Figure 14:
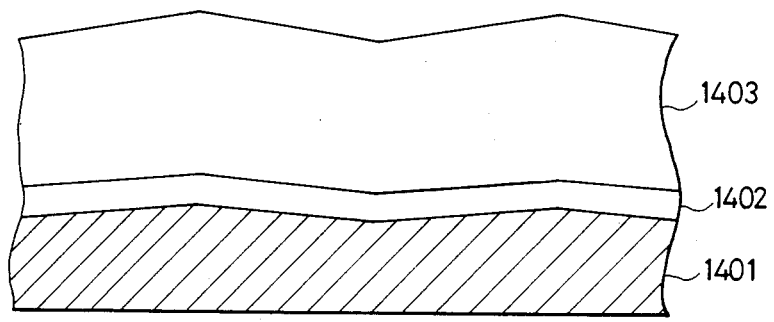

When the above high frequency power was made 150 W, the surface of the photosensitive layer 1403 and the surface of the substrate 1401 were unparallel to each other as shown in FIG. 14. In this case, the layer thickness difference in average layer thickness between the center and the both end portions was 2 $\mu$m.

For the two kinds of the light receiving members for electrophotography, image exposure was effected by means of the device shown in FIG. 15 with a semiconductor laser of a wavelength 780 nm with a spot size of 80 $\mu$m, followed by developing and transfer to obtain images. In the light receiving member with the surface characteristic as shown in FIG. 13 prepared at a high frequency power of 50 W, interference fringe pattern was observed.

On the other hand, in the light receiving member having the surface characteristic as shown in FIG. 14, no interference fringe pattern was observed and there could be obtained a member exhibiting practically satisfactory electrophotographic characteristics.

EXAMPLE 2

The surfaces of cylindrical aluminum substrates were worked by a lathe as shown in Table 1A. On these (Nos. 101–108) aluminum substrates were prepared light receiving members for electrophotography under the same conditions as in Example 1 where no interference fringe pattern was observed (high frequency power 150

W) (Nos. 111A–118A). The difference in average layer thickness between the center and the both end portions of the aluminum substrate in the light receiving member for electrophotography was 2 μm.

The cross-sections of these light receiving members for electrophotography were observed by an electron microscope and the differences within the pitch of the photosensitive layer were measured to obtain the results as shown in Table 2A. For these light receiving members, image exposure was effected by means of the same device as shown in FIG. 15 similarly as in Example 1 using a semiconductor laser of wavelength 780 nm with a spot size of 80 μm to obtain the results as shown in Table 2A.

EXAMPLE 3

Light receiving members were prepared under the same conditions as in Example 2 except for the following points (No. 121A–128A). The charge injection preventive layer was made to have a thickness of 10 μm. The difference in average layer thickness between the center and the both ends of the charge injection preventive layer was 1 μm, with the average difference in thickness distribution between the center and the both ends of the photosensitive layer was 2 μm. When the thickness of each layer prepared on each substrate of Nos. 121A–128A was observed by an electron microscope, the results as shown in Table 3A were obtained. For these light receiving members, image exposure was conducted in the same image exposure device as in Example 1 to obtain the results as shown in Table 3A.

EXAMPLE 4

On cylindrical aluminum substrates (Nos. 201–207) having the surface characteristic as shown in Table 4A, light receiving members provided with silicon oxide layer as the charge injection preventive layer were prepared as follows.

The silicon oxide layer was formed under the same conditions as the preparation of the charge injection preventive layer in Example 2, except for changing the flow rate of SiH$_4$ to 50 SCCM and that of NO to 60 SCCM, to a thickness of 0.2 μm.

On the silicon oxide layer was formed a photosensitive layer with a thickness of 20 μm under the same conditions as in Example 2.

The difference in average layer thickness between the center and both ends of the light receiving member for electrophotography thus prepared was 1 μm.

When these photosensitive members were observed by an electron microscope, the difference in the layer thickness of the silicon oxide layer within the pitch on the surface of the aluminum cylinder was 0.06 μm. Similarly, the difference in the layer thickness of A—Si:H photosensitive layer can be seen from the results shown in Table 5A. When these light receiving members for electrophotography (211A–217A) were subjected to image exposure with laser beam similarly as described in Example 1, the results as shown in Table 5A were obtained.

EXAMPLE 5

Light receiving members having a silicon nitride layer as the charge injection preventive layer provided on cylindrical aluminum substrates having surface characteristics as shown in Table 4A (Nos. 201–207) prepared as follows.

The silicon nitride layer was formed by replacing NO gas with NH$_3$ gas and changing the flow rate of SiH$_4$ gas to 30 SCCM and the flow rate of NH$_3$ gas to 200 SCCM in Example 4, following otherwise the same conditions as in preparation of the charge injection preventive layer in Example 2, to a thickness of 0.2 μm.

On the silicon nitride layer was formed a photosensitive layer to a thickness of 20 μm similarly as in Example 2 except for changing the high frequency power to 100 W. The difference in average thickness between the center and the both ends of the light receiving member thus prepared was 1 μm.

When the layer thickness difference within each pitch in the light receiving member for electrophotography was measured by an electron microscope, the layer thickness difference was 0.05 μm or less in the silicon nitride layer.

On the other hand, in the A—Si:H photosensitive layer, the layer thickness difference within each pitch can be seen from the results shown in Table 6.

These light receiving members for electrophotography (Nos. 221A–227A) were subjected to image exposure with laser beam similarly as in Example 1 to obtain the results as shown in Table 6A.

EXAMPLE 6

Light receiving members having a silicon carbide layer provided as the charge injection preventive layer on the cylindrical aluminum substrates (Nos. 201–207) having surface characteristics as shown in Table 4A were prepared as follows.

The silicon carbide layer was formed with the use of CH$_4$ gas and SiH$_4$ gas at a flow rate of CH$_4$ gas of 600 SCCM and a flow rate of SiH$_4$ gas of 20 SCCM, following otherwise the same conditions as in preparation of the charge injection preventive layer in Example 2, to a thickness of 0.3 μm.

On the silicon carbide layer, A—Si:H photosensitive layer was formed to a thickness of 20 μm at a high frequency power of 200 W under otherwise the same conditions as in Example 2.

The difference in average layer thickness betweeen the center and the both ends of the A—Si photosensitive member for electrophotography thus prepared was 1.5 μm.

When the photosensitive member for electrophotography of A—Si was observed by an electron microscope, the difference in layer thickness within each pitch was 0.07 μm in the silicon carbide layer.

On the other hand, the difference in layer thickness within each pitch in A—Si:H layer can be seen from the results as shown in Table 7A.

These light receiving members for electrophotography (Nos. 231A–237A) were subjected to image exposure with laser beam similarly as in Example 1 to obtain the results as shown in Table 7A.

COMPARATIVE EXAMPLE 1

As a comparative test, an A—Si light receiving member for electrophotography was prepared according to entirely the same method as the light receiving member for electrophotography prepared at a high frequency power of 150 W in Example 1 except for employing an aluminum substrate whose surface had been roughened by the sand blast method in place of the aluminum substrate used in preparation of the light receiving member for electrophotography in Example 1. The surface condition of the aluminum substrate subjected to the surface roughening treatment by the sane blast method was subjected to measurement before provision of the light receiving layer by means of the universal surface shape measuring instrument (SE-3C) produced by Kosaka Research Institute to find that the average surface roughness was 1.8 μm.

The comparative light receiving member for electrophotography was mounted on the device shown in FIG. 15 as employed in Example 1 and similar measurement was conducted. As the result, clear interference fringe was found to be formed in the black image over the whole surface.

EXAMPLE 7

In this Example, a semiconductor laser (wavelength: 780 nm) with a spot size of 80 μm was employed. Thus, on a cylindrical aluminum substrate (length (L) 357 mm, outer diameter (r) 80 mm) on which A—Si:H is to be deposited, a spiral groove was prepared by a lathe with a pitch (P) of 25 μm and a depth (D) of 0.8 S. The form of the groove is shown in FIG. 11.

On this aluminum substrate, the charge injection preventive layer and the photosensitive layer were deposited by means of the device as shown in FIG. 12 in the following manner.

First, the constitution of the device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1206 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen (H$_2$) bomb, 1262 is a silane (SiH$_4$) bomb, 1263 is a diborane (B$_2$H$_6$) bomb, 1264 is a nitrogen monoxide (NO) bomb and 1267 is a methane (CH$_4$) bomb.

Next, the preparation procedure is to be explained. All of the main cocks of the bombs 1261–1265 were closed, all the mass flow controllers and the valves were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the temperature of the aluminum substrate 1205 became constantly at 250° C., the valves 1221–1225, 1241–1245 and 1251–1255 were closed, the main cocks of bombs 1261–1265 were opened and the diffusion pump 1203 was changed to the mechanical booster pump. The secondary pressure of the valves equipped with regulators 1251–1255 was set at 1.5 kg/cm$^2$. The mass flow controller 1231 was set at 300 SCCM, and the valves 1241 and 1221 were successively opened to introduce H$_2$ gas in bomb 1261 into the deposition device.

Next, by setting the mass flow controller 1232 at 150 SCCM, SiH$_4$ gas in bomb 1262 was introduced into the deposition device according to the same procedure as introduction of H$_2$ gas. Then, by setting the mass flow controller 1233 so that B$_2$H$_6$ gas flow rate may be 1600 Vol. ppm relative to SiH$_4$ gas flow rate, B$_2$H$_6$ gas was introduced into the deposition device according to the same procedure as introduction of H$_2$ gas.

Next, by setting the mass flow controller 1234 so that the NO gas flow rate of 1264 may be 3.4 Vol. % relative to the SiH$_4$ gas flow rate, No gas was introduced into the deposition device according to the same procedure as introduction of H$_2$ gas.

When the inner pressure in the deposition device was stabilized at 0.2 Torr, the high frequency power source 1201 was turned on and glow discharge was generated between the aluminum substrate 1205 and the cathode electrode 1208 by controlling the matching box, and a A—Si:H:B layer (p-type A—Si:H layer containing B) was deposited to a thickness of 5 μm at a high frequency power of 150 W (charge injection preventive layer). After deposition of a 5 μm thick A—Si:H:B layer (p-type), inflow of B$_2$H$_6$ was stopped by closing the valve 1223 without discontinuing discharging.

And, A—Si:H layer (non-doped) with a thickness of 20 μm was deposited at a high frequency power of 150 W (photosensitive layer). Then, with the high frequency power source and all the valves being closed, the deposition device was evacuated, the temperature of the aluminum substrate was lowered to room temperature and the substrate on which the light receiving layer was formed was taken out.

Separately, when a charge injection preventive layer and a photosensitive layer were formed on the same cylindrical aluminum substrate with the same surface characteristic under the same conditions and according to the same procedure as in the above case except for changing the high frequency power to 40 W, the surface of the photosensitive layer 1303 was found to be parallel to the surface of the substrate 1301, as shown in FIG. 13. The difference in the total layer thickness between the center and the both end portions of the aluminum substrate was 1 μm.

When the above high frequency power was made 160 W, the surface of the photosensitive layer 1403 and the surface of the substrate 1401 were unparallel to each other as shown in FIG. 14. In this case, the layer thickness difference in average layer thickness between the center and the both end portions was 2 μm.

For the two kinds of the light receiving members for electrophotography, image exposure was effected by means of the device shown in FIG. 15 with a semiconductor laser of a wavelength 780 nm with a spot size of 80 μm, followed by developing and transfer to obtain images. In the light receiving member with the surface characteristic as shown in FIG. 13 prepared at a high frequency power of 40 W, interference fringe pattern was observed.

On the other hand, in the light receiving member having the surface characteristic as shown in FIG. 14, no interference fringe pattern was observed and there could be obtained a member exhibiting practically satisfactory electrophotographic characteristics.

EXAMPLE 8

The surfaces of cylindrical aluminum substrates were worked by a lathe as shown in Table 1A. On these aluminum substrates (Cylinder Nos. 101-108) were prepared light receiving members for electrophotography under the same conditions as in Example 7 where no interference fringe pattern was observed (high frequency power 160 W) (Nos. 111B-118B). The difference in average layer thickness between the center and the both end portions of the aluminum substrate in the light receiving member for electrophotography was 2.2 μm.

The cross-sections of these light receiving members for electrophotography were observed by an electron microscope and the differences within the pitch of the photosensitive layer were measured to obtain the results as shown in Table 2B. For these light receiving members, image exposure was effected by means of the same device as shown in FIG. 15 similarly as in Example 7 using a semiconductor laser of wavelength 780 nm with a spot size of 80 μm to obtain the results as shown in Table 2B.

EXAMPLE 9

Light receiving members were prepared under the same conditions as in Example 8 except for the following points (Nos. 121B-128B). The charge injection preventive layer was made to have a thickness of 10 μm. The difference in average layer thickness between the center and the both ends of the charge injection preventive layer was 1.2 μm, with the average difference in thickness distribution between the center and the both ends of the photosensitive layer was 2.3 μm. When the thickness of each layer prepared on each substrate of Nos. 121B-128B was observed by an electron microscope, the results as shown in Table 3B were obtained. For these light receiving members, image exposure was conducted in the same image exposure device as in Example 7 to obtain the results as shown in Table 3B.

EXAMPLE 10

On cylindrical aluminum substrates (Nos. 101-108) having the surface characteristic as shown in Table 1A, light receiving members provided with the charge injection preventive layer containing nitrogen were prepared under the conditions as shown in Table 4B (Nos. 401B-408B).

The cross-sections of the light receiving members prepared under the above conditions were observed by an electron microscope. The average layer thickness of the charge injection preventive layer at the center and both ends of the cylinder was 0.09 μm. The average layer thickness of the photosensitive layer was 3 μm at the enter and both ends of the cylinder.

The layer thickness difference within the short range of the photosensitive layer of each light receiving member can be seen from the results shown in Table 5B.

When these light receiving members were subjected to image exposure with laser beam similarly as described in Example 7, the results as shown in Table 5B were obtained.

EXAMPLE 11

On cylindrical aluminum substrates (Nos. 101-108) having the surface characteristic as shown in Table 1A, light receiving members provided with the charge injection preventive layer containing nitrogen were prepared under the conditions as shown in Table 6B (Nos. 501B-508B).

The cross-sections of the light receiving members prepared under the above conditions were observed by an electron microscope. The average layer thickness of the charge injection preventive layer at the center and both ends of the cylinder was 0.3 μm. The average layer thickness of the photosensitive layer was 3.2 μm at the enter and both ends of the cylinder.

The layer thickness difference within the short range of the photosensitive layer of each light receiving member can be seen from the results shown in Table 7B.

When these light receiving members were subjected to image exposure with laser beam similarly as described in Example 7, the results as shown in Table 7B were obtained.

EXAMPLE 12

On cylindrical aluminum substrates (Nos. 101-108) having the surface characteristic as shown in Table 1A, light receiving members provided with the charge injection preventive layer containing carbon were prepared under the conditions as shown in Table 8B (Nos. 901B-908B).

The cross-sections of the light receiving members prepared under the above conditions were observed by an electron microscope. The average layer thickness of the charge injection preventive layer at the center and both ends of the cylinder was 0.08 μm. The average layer thickness of the photosensitive layer was 2.5 μm at the center and both ends of the cylinder.

The layer thickness difference within the short range of the photosensitive layer of each light receiving member can be seen from the results shown in Table 9B.

When these light receiving members were subjected to image exposure with laser beam similarly as described in Example 7, the results as shown in Table 9B were obtained.

EXAMPLE 13

On cylindrical aluminum substrates (Nos. 101-107) having the surface characteristic as shown in Table 1A, light receiving members provided with the charge injection preventive layer containing carbon were prepared under the conditions as shown in Table 10B (Nos. 1101B-1108B).

The cross-sections of the light receiving members prepared under the above conditions were observed by an electron microscope. The average layer thickness of the charge injection preventive layer at the center and both ends of the cylinder was 1.1 μm. The average layer thickness of the light receiving layer was 3.4 μm at the center and both ends of the cylinder.

The layer thickness difference within the short range of the photosensitive layer of each light receiving member can be seen from the results shown in Table 11B.

When these light receiving members were subjected to image exposure with laser beam similarly as described in Example 7, the results as shown in Table 11B were obtained.

EXAMPLE 14

In this Example, a semiconductor laser (wavelength: 780 nm) with a spot size of 80 μm was employed. Thus, on a cylindrical aluminum substrate (length (L) 357 mm, outer diameter (r) 80 mm) on which A—Si:H is to be deposited, a spiral groove was prepared by a lathe with a pitch (P) of 25 μm and a depth (D) of 0.8 S. The form of the groove is shown in FIG. 11.

On this aluminum substrate, the charge injection preventive layer and the photosensitive layer were deposited by means of the device as shown in FIG. 12 in the following manner.

First, the constitution of the device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1026 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen ($H_2$) bomb, 1262 is a silane (SiH$_4$) bomb, 1263 is a diborane (B$_2$H$_6$) bomb, 1264 is a nitrogen monoxide (NO) bomb and 1267 is a methane (CH$_4$) bomb.

Next, the preparation procedure is to be explained. All of the main cocks of the bombs 1261-1265 were closed, all the mass flow controllers 1231-1235 and the valves 1221-1225 and 1241-1245 were opened and the deposition device was internally evacuated by the diffusion pump 1203 to 10$^{-7}$ Torr. At the same time, the aluminum substrate 1205 was heated by the heater 1206 to 250° C. and maintained constantly at 250° C. After the temperature of the aluminum substrate 1205 became constantly at 250° C., the valves 1221-1225, 1241-1245 and 1251-1255 were closed, the main cocks of bombs 1261-1265 were opened and the diffusion pump 1203 was changed to the mechanical booster pump. The secondary pressure of the valve equipped with regulators was set at 1.5 kg/cm$^2$. The mass flow controller 1231 was wet at 300 SCCM, and the valves 1241 and 1221 were successively opened to introduce H$_2$ gas into the deposition device.

Next, by setting the mass flow controller 1232 at 150 SCCM, SiH$_4$ gas in bomb 1262 was introduced into the deposition device according to the same procedure as introduction of H$_2$ gas. Then, by setting the mass flow controller 1233 so that B$_2$H$_6$ gas flow rate may be 1600 Vol. ppm relative to SiH$_4$ gas flow rate, B$_2$H$_6$ gas was introduced into the deposition device according to the same procedure as introduction of H$_2$ gas.

Next, by setting the mass flow controller 1234 so that the initial value of the flow rate of the NO gas of 1264 may be 3.4 Vol. % relative to the SiH$_4$ gas flow rate, NO gas was introduced into the deposition device according to the same procedure as introduction of H$_2$ gas.

When the inner pressure in the deposition device was stabilized at 0.2 Torr, the high frequency power source 1201 was turned on and glow discharge was generated between the aluminum substrate 1205 and the cathode electrode 1208 by controlling the matching box 1202 and a A—Si:H:B:O layer (p-type A—Si:H layer containing B and O) was deposited to a thickness of 5 μm at a high frequency power of 160 W (charge injection preventive layer). During this operation, the NO gas flow rate was changed relative to the SiH$_4$ gas flow rate as shown in FIG. 22 so that the NO gas flow rate on completion of the layer formation became zero. After forming thus a A—Si:H:B:O (p-type) layer deposited to a thickness of 5 μm, the valves 1223 and 1224 were closed to terminate inflow of B$_2$H$_6$ and NO without discontinuing discharging.

And, A—Si:H layer (non-doped) with a thickness of 20 μm was deposited at a high frequency power of 160 W (photosensitive layer). Then, with the high frequency power source being turned off and with all the valves being closed, the deposition device was evacuated, the temperature of the aluminum substrate was lowered to room temperature and the substrate on which the light receiving layer was formed was taken out (Sample No. 1-1C)

Separately, when a charge injection preventive layer and a photosensitive layer were formed on the same cylindrical aluminum substrate with the same surface characteristic under the same conditions and according to the same procedure as in the above case except for changing the high frequency power to 40 W, the surface of the photosensitive layer 1303 was found to be parallel to the surface of the substrate 1301, as shown in FIG. 13. The difference in the total layer thickness between the center and the both end portions of the aluminum substrate 1301 was 1 μm. (Sample No. 1-2C).

When the above high frequency power was made 160 W (Sample No. 1-1C), the surface of the photosensitive layer 1403 and the surface of the substrate 1401 were unparallel to each other as shown in FIG. 14. In this case, the layer thickness difference in average layer thickness between the center and the both end portions was 2 μ.

For the two kinds of the light receiving members for electrophotography, image exposure was effected by means of the device shown in FIG. 15 with a semiconductor laser of a wavelength 780 nm with a spot size of 80 μm, followed by developing and transfer to obtain images. In the light receiving member with the surface characteristic as shown in FIG. 13 prepared at a high frequency power of 40 W, interference fringe pattern was observed.

On the other hand, in the light receiving member having the surface characteristic as shown in FIG. 14, no interference fringe pattern was observed and there could be obtained a member exhibiting practically satisfactory electrophotographic characteristics.

EXAMPLE 15

The surfaces of cylindrical aluminum substrates were worked by a lathe as shown in Table 1A. On these aluminum substrates (Cylinder Nos. 101-108) were prepared light receiving members for electrophotography under the same conditions as in Example 14 where no interference fringe pattern was observed (high frequency power 160 W) (Nos. 111C-118C). The difference in average layer thickness between the center and the both end portions of the aluminum substrate in the light receiving member for electrophotography was 2.2 μm.

The cross-sections of these light receiving members for electrophotography were observed by an electron microscope and the differences within the pitch of the photosensitive layer were measured to obtain the results as shown in Table 2C. For these light receiving members, image exposure was effected by means of the same device as shown in FIG. 15 similarly as in Example 14 using a semiconductor laser of wavelength 780 nm with a spot size of 80 μm to obtain the results as shown in Table 2C.

EXAMPLE 16

Light receiving members were prepared under the same conditions as in Example 15 except for the following points (Nos. 121C-128C). The charge injection preventive layer was made to have a thickness of 10 μm. The difference in average layer thickness between the center and the both ends of the charge injection preventive layer was 1.2 μm, with the average difference in thickness distribution between the center and the both ends of the photosensitive layer was 2.3 μm. When the thickness of each layer of No. 121C-128C was observed by an electron microscope, the results as shown in Table 3C were obtained. For these light receiving members, image exposure was conducted in the same image exposure device as in Example 14 to obtain the results as shown in Table 3C.

EXAMPLE 17

On cylindrical aluminum substrates (Nos. 101-108) having the surface characteristic as shown in Table 1A, light receiving members provided with the charge injection preventive layer containing nitrogen were prepared under the conditions as shown in Table 4C (Nos. 401C–408C), following otherwise the same conditions and procedure as in Example 14.

The cross-sections of the light receiving members prepared under the above conditions were observed by an electron microscope. The average layer thickness of the charge injection preventive layer at the center and both ends of the cylinder was 0.09 μm. The average layer thickness of the photosensitive layer was 3 μm at the center and both ends of the cylinder.

The layer thickness difference within the short range of the photosensitive layer of each light receiving member (Sample Nos. 401C–408C) can be seen from the results shown in Table 5C.

When these light receiving members (Sample Nos. 401C–408C) were subjected to image exposure with laser beam similarly as described in Example 14, the results as shown in Table 5C were obtained.

EXAMPLE 18

On cylindrical aluminum substrates (Nos. 101–108) having the surface characteristic as shown in Table 1A, light receiving members provided with the charge injection preventive layer containing nitrogen were prepared under the conditions as shown in Table 6C (Nos. 501C–508C), following otherwise the same conditions and the procedure as in Example 14.

The cross-sections of the light receiving members prepared under the above conditions were observed by an electron microscope. The average layer thickness of the charge injection preventive layer at the center and both ends of the cylinder was 0.3 μm. The average layer thickness of the photosensitive layer was 3.2 μm at the center and both ends of the cylinder.

The layer thickness difference within the short range of the photosensitive layer of each light receiving member (Sample Nos. 501C–508C) can be seen from the results shown in Table 7C.

When these light receiving members (Sample Nos. 501C–508C) were subjected to image exposure with laser beam similarly as described in Example 14, the results as shown in Table 7C were obtained.

EXAMPLE 19

On cylindrical aluminum substrates (Nos. 101–108) having the surface characteristic as shown in Table 1A, light receiving members provided with the charge injection preventive layer containing carbon were prepared under the conditions as shown in Table 8C (No. 901C–908C), following otherwise the same conditions and the procedure as in Example 14.

The cross-sections of the light receiving members (Sample Nos. 901C–908C) prepared under the above conditions were observed by an electron microscope. The average layer thickness of the charge injection preventive layer at the center and both ends of the cylinder was 0.08 μm. The average layer thickness of the photosensitive layer was 2.5 μm at the center and both ends of the cylinder.

The layer thickness difference within the short range of the photosensitive layer of each member (Sample Nos. 901C–908C) can be seen from the results shown in Table 9C.

When these light receiving members (Sample Nos. 901C–908C) were subjected to image exposure with laser beam similarly as described in Example 14, the results as shown in Table 9C were obtained.

EXAMPLE 20

On cylindrical aluminum substrates (Nos. 101–108) having the surface characteristic as shown in Table 1A, light receiving members provided with the charge injection preventive layer containing carbon were prepared under the conditions as shown in Table 10C, following otherwise the same conditions and the procedure as in Example 14. (Nos. 1101C–1108C).

The cross-sections of the light receiving members (Nos. 1101C–1108C) prepared under the above conditions were observed by an electron microscope. The average layer thickness of the charge injection preventive layer at the center and both ends of the cylinder was 1.1 μm. The average layer thickness of the photosensitive layer was 3.4 μm at the center and both ends of the cylinder.

The layer thickness difference within the short range of the photosensitive layer of each light receiving member (Nos. 1101C–1108C) can be seen from the results shown in Table 11C.

When these light receiving members were subjected to image exposure with laser beam similarly as described in Example 14, the results as shown in Table 11C were obtained.

EXAMPLE 21

By means of the preparation device shown in FIG. 12, respective light receiving members for electrophotography (Sample Nos. 1201C–1204C) were prepared by carrying out layer formation on cylindrical aluminum substrates (Cylinder No. 105) under the respective conditions as shown in Table 12C to Table 15C while changing the gas flow rate ratio of NO to SiH$_4$ according to the change rate curve of the gas flow rate ratio as shown in FIG. 25 to FIG. 28 with lapse of time for layer formation.

The thus prepared light receiving members were subjected to evaluation of characteristics, following the same conditions and the same procedure as in Example 14. As the result, in each sample, no interference fringe pattern was observed at all with naked eyes, and sufficiently good electrophotographic characteristics could be exhibited as suited for the object of the present invention.

EXAMPLE 22

Figure 25:
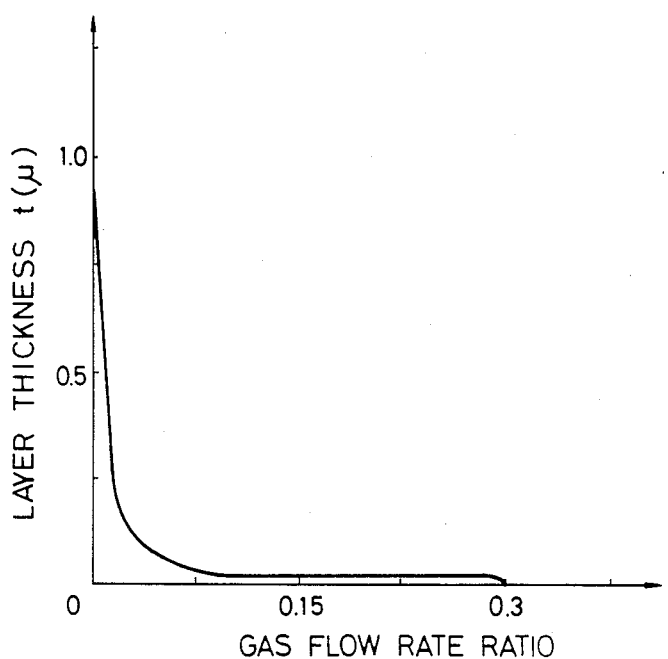
FIGS. 25 through 28 are each schematic illustrations showing the change rate curve of the gas flow rate ratio.
Figure 26:
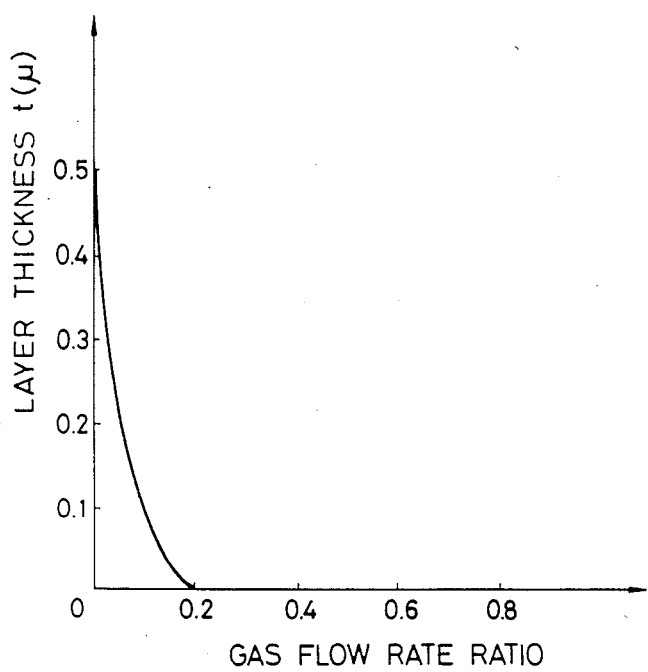
Figure 27:
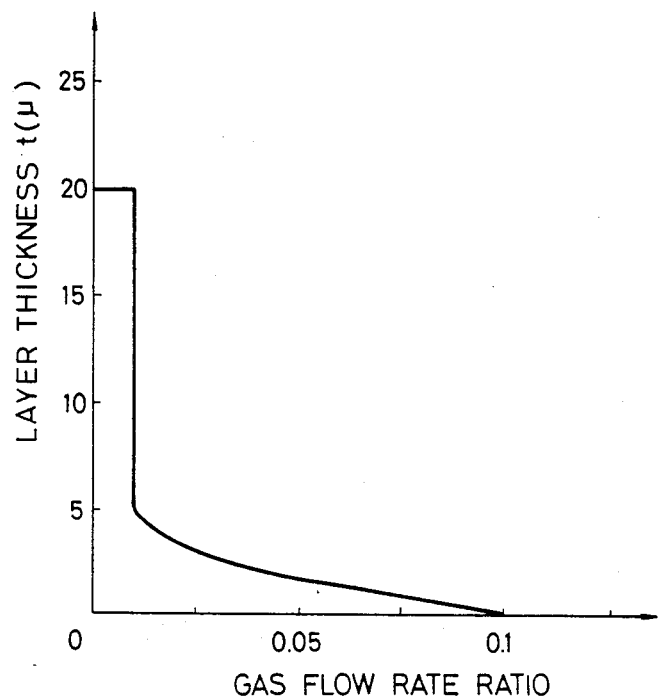
Figure 28:
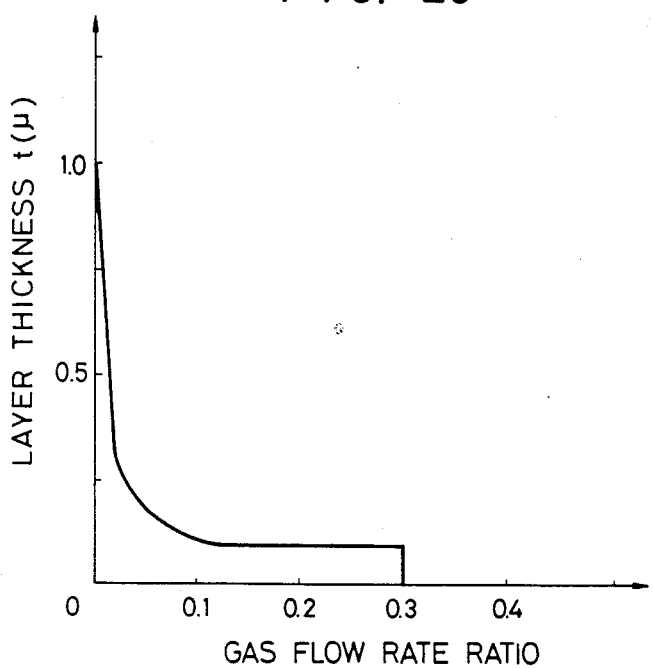

By means of the preparation device shown in FIG. 12, a light receiving member for electrophotography was prepared by carrying out layer formation on cylindrical aluminum substrates (Cylinder No. 105) under the conditions as shown in Table 16C while changing the gas flow rate ratio of NO to SiH$_4$ according to the change rate curve of the gas flow rate ratio as shown in FIG. 25 with lapse of time for layer formation.

The thus prepared light receiving member were subjected to evaluation of characteristics, following the same conditions and the same procedure as in Example 14. As the result, no interference fringe pattern was observed at all with naked eyes, and sufficiently good electrophotographic characteristics could be exhibited as suited for the object of the present invention.

TABLE 1A

| NO. | 101 | 102 | 103 | 104 | 105 | 106 | 107 | 108 |
| --- | --- | --- | --- | --- | --- | --- | --- | --- |
| Pitch | 600 | 200 | 100 | 50 | 40 | 25 | 10 | 5.0 |

TABLE 1A-continued

| NO. | 101 | 102 | 103 | 104 | 105 | 106 | 107 | 108 |
|---|---|---|---|---|---|---|---|---|
| Depth (μm) | 1.0 | 10 | 1.8 | 2.1 | 1.7 | 0.8 | 0.2 | 2 |
| Angle (degree) | 0.2 | 5.7 | 2.1 | 5.0 | 4.8 | 3.7 | 2.3 | 38 |

TABLE 2A

| NO. | 111A | 112A | 113A | 114A | 115A | 116A | 117A | 118A |
|---|---|---|---|---|---|---|---|---|
| Cylinder NO. | 101 | 102 | 103 | 104 | 105 | 106 | 107 | 108 |
| Difference in layer thickness (μm) | 0.05 | 0.07 | 0.15 | 0.17 | 0.4 | 0.3 | 0.1 | 3 |
| Interference fringe | X | X | ○ | ○ | ◎ | ◎ | Δ | X |

X Practically unusable
Δ Practically satisfactory
○ Practically very good
◎ Practically excellent

TABLE 3A

| NO. | 121A | 122A | 123A | 124A | 125A | 126A | 127A | 128A |
|---|---|---|---|---|---|---|---|---|
| Cylinder NO. | 101 | 102 | 103 | 104 | 105 | 106 | 107 | 108 |
| Difference in layer thickness of first layer | 0.04 | 0.04 | 0.04 | 0.18 | 0.3 | 0.2 | 0.7 | 2.5 |
| Difference in layer thickness of second layer | 0.05 | 0.05 | 0.09 | 0.02 | 0.4 | 0.3 | 0.8 | 3 |
| Interference fringe | X | X | ○ | ○ | ◎ | ◎ | Δ | X |

TABLE 4A

| NO. | 201A | 202A | 203A | 204A | 205A | 206A | 207A |
|---|---|---|---|---|---|---|---|
| Pitch (μm) | 40 | 30 | 25 | 20 | 10 | 5 | 2 |
| Depth (μm) | 3.5 | 2.5 | 0.87 | 1 | 0.7 | 0.1 | 0.5 |
| Angle (degree) | 10 | 7.5 | 4 | 6 | 8 | 2.3 | 26 |

X Practically unusable
Δ Practically satisfactory
○ Practically very good
◎ Practically excellent

TABLE 5A

| NO. | 211A | 212A | 213A | 214A | 215A | 216A | 217A |
|---|---|---|---|---|---|---|---|
| Cylinder NO. | 201 | 202 | 203 | 204 | 205 | 206 | 207 |
| Difference in layer thickness (μm) | 0.1 | 0.1 | 0.3 | 0.25 | 0.7 | 0.1 | 2.1 |
| Interference fringe | Δ | ○ | ◎ | ◎ | ◎ | Δ | X |

TABLE 6A

| NO. | 221A | 222A | 223A | 224A | 225A | 226A | 227A |
|---|---|---|---|---|---|---|---|
| Cylinder NO. | 201 | 202 | 203 | 204 | 205 | 206 | 207 |
| Difference in layer thickness (μm) | 0.05 | 0.1 | 0.1 | 0.3 | 0.5 | 0.05 | 2.05 |
| Interference fringe | X | Δ | ○ | ◎ | ◎ | X | X |

TABLE 6A-continued

| NO. | 221A | 222A | 223A | 224A | 225A | 226A | 227A |
|---|---|---|---|---|---|---|---|
| fringe | | | | | | | |

X Practically unusable
Δ Practically satisfactory
○ Practically very good
◎ Practically excellent

TABLE 7A

| NO. | 231A | 232A | 233A | 234A | 235A | 236A | 237A |
|---|---|---|---|---|---|---|---|
| Cylinder NO. | 201 | 202 | 203 | 204 | 205 | 206 | 207 |
| Difference in layer thickness (μm) | 0.1 | 0.3 | 0.35 | 0.3 | 1.0 | 0.1 | 2.5 |
| Interference fringe | Δ | ◎ | ◎ | ◎ | ◎ | ○ | X |

TABLE 2B

| NO. | 111B | 112B | 113B | 114B | 115B | 116B | 117B | 118B |
|---|---|---|---|---|---|---|---|---|
| Cylinder NO. | 101 | 102 | 103 | 104 | 105 | 106 | 107 | 108 |
| Difference in layer thickness (μm) | 0.06 | 0.08 | 0.16 | 0.18 | 0.41 | 0.31 | 0.11 | 3.2 |
| Interference fringe | X | X | ○ | ○ | ◎ | ◎ | Δ | X |

X Practically unusable
Δ Practically satisfactory
○ Practically very good
◎ Practically excellent

TABLE 3B

| NO. | 121B | 122B | 123B | 124B | 125B | 126B | 127B | 128B |
|---|---|---|---|---|---|---|---|---|
| Cylinder NO. | 101 | 102 | 103 | 104 | 105 | 106 | 107 | 108 |
| Difference in layer thickness of first layer (μm) | 0.05 | 0.041 | 0.1 | 0.19 | 0.31 | 0.22 | 0.1 | 2.6 |
| Difference in layer thickness of second layer (μm) | 0.06 | 0.07 | 0.11 | 0.22 | 0.41 | 0.32 | 0.1 | 3.6 |
| Interference fringe | X | X | | | | | Δ | X |

X Practically unusable
Δ Practically satisfactory
○ Practically very good
◎ Practically excellent

TABLE 4B

| Name of layer | Starting gas | Flow rate (SCCM) | High frequency power (W) | Layer thickness (μm) |
|---|---|---|---|---|
| Charge injection preventive layer | H₂<br>SiH₄<br>NH₃<br>B₂H₆ | 300<br>150<br>30<br>0.24 | 160 | 3 |
| Photo-sensitive layer | H₂<br>SiH₄ | 300<br>300 | 300 | 20 |

TABLE 5B

| NO. | 401B | 402B | 403B | 404B | 405B | 406B | 407B | 408B |
|---|---|---|---|---|---|---|---|---|
| Cylinder NO. | 101 | 102 | 103 | 104 | 105 | 106 | 107 | 108 |
| Difference | 0.07 | 0.08 | 0.17 | 0.20 | 0.42 | 0.33 | 0.11 | 2.8 |

TABLE 5B-continued

| NO. | 401B | 402B | 403B | 404B | 405B | 406B | 407B | 408B |
|---|---|---|---|---|---|---|---|---|
| in layer thickness (μm) | | | | | | | | |
| Interference fringe | X | X | ○ | ◉ | ◎ | ○ | Δ | X |

X Practically unusable
Δ Practically satisfactory
○ Practically very good
◎ Practically excellent

TABLE 6B

| Name of layer | Starting gas | Flow rate (SCCM) | High frequency power (W) | Layer thickness (μm) |
|---|---|---|---|---|
| Charge injection preventive layer | H₂<br>SiH₄<br>NH₃<br>B₂H₆ | 300<br>150<br>15<br>0.3 | 160 | 5 |
| Photo-sensitive layer | H₂<br>SiH₄ | 300<br>300 | 200 | 20 |

TABLE 7B

| NO. | 501B | 502B | 503B | 504B | 505B | 506B | 507B | 508B |
|---|---|---|---|---|---|---|---|---|
| Cylinder NO. | 101 | 102 | 103 | 104 | 105 | 106 | 107 | 108 |
| Difference in layer thickness of first layer (μm) | 0.05 | 0.07 | 0.1 | 0.21 | 0.31 | 0.22 | 0.1 | 2.6 |
| Difference in layer thickness of second layer (μm) | 0.06 | 0.08 | 0.1 | 0.2 | 0.41 | 0.35 | 0.1 | 3.5 |
| Interference fringe | X | X | ○ | ◉ | ◎ | ○ | Δ | X |

X Practically unusable
Δ Practically satisfactory
○ Practically very good
◎ Practically excellent

TABLE 8B

| Name of layer | Starting gas | Flow rate (SCCM) | High frequency power (W) | Layer thickness (μm) |
|---|---|---|---|---|
| Charge injection preventive layer | H₂<br>SiH₄<br>CH₄<br>B₂H₆ | 300<br>150<br>15<br>0.45 | 170 | 2.8 |
| Photo-sensitive layer | H₂<br>SiH₄ | 300<br>300 | 200 | 21 |

TABLE 9B

| NO. | 901B | 902B | 903B | 904B | 905B | 906B | 907B | 908B |
|---|---|---|---|---|---|---|---|---|
| Cylinder NO. | 101 | 102 | 103 | 104 | 105 | 106 | 107 | 108 |
| Difference in layer thickness (μm) | 0.07 | 0.09 | 0.16 | 0.19 | 0.46 | 0.35 | 0.1 | 3.2 |
| Interference fringe | X | X | ○ | ○ | ◉ | ◉ | Δ | X |

X Practically unusable
Δ Practically satisfactory
○ Practically very good
◉ Practically excellent

TABLE 10B

| Name of layer | Starting gas | Flow rate (SCCM) | High frequency power (W) | Layer thickness (μm) |
|---|---|---|---|---|
| Charge injection preventive layer | H₂<br>SiH₄<br>CH₄<br>B₂H₆ | 300<br>160<br>16<br>0.4 | 170 | 5.1 |
| Photo-sensitive layer | H₂<br>SiH₄ | 300<br>300 | 230 | 22 |

TABLE 11B

| NO. | 1101B | 1102B | 1103B | 1104B | 1105B | 1106B | 1107B | 1108B |
|---|---|---|---|---|---|---|---|---|
| Cylinder NO. | 101 | 102 | 103 | 104 | 105 | 106 | 107 | 108 |
| Difference in layer thickness of first layer (μm) | 0.05 | 0.06 | 0.1 | 0.22 | 0.31 | 0.21 | 0.1 | 2.7 |
| Difference in layer thickness of second layer (μm) | 0.07 | 0.08 | 0.11 | 0.35 | 0.45 | 0.31 | 0.1 | 3.5 |
| Interference fringe | X | X | ○ | ◉ | ◉ | ◉ | Δ | X |

TABLE 2C

| NO. | 111C | 112C | 113C | 114C | 115C | 116C | 117C | 118C |
|---|---|---|---|---|---|---|---|---|
| Cylinder NO. | 101 | 102 | 103 | 104 | 105 | 106 | 107 | 108 |
| Difference in layer thickness (μm) | 0.06 | 0.08 | 0.16 | 0.18 | 0.41 | 0.31 | 0.11 | 3.2 |
| Interference fringe and electrophotographic characteristics | X | X | ○ | ○ | ◉ | ◉ | Δ | X |

X Practically unusable
Δ Practically satisfactory
○ Practically very good
◉ Practically excellent

TABLE 3C

| NO. | 121C | 122C | 123C | 124C | 125C | 126C | 127C | 128C |
|---|---|---|---|---|---|---|---|---|
| Cylinder NO. | 101 | 102 | 103 | 104 | 105 | 106 | 107 | 108 |
| Difference in layer thickness of first layer ($\mu$m) | 0.05 | 0.041 | 0.1 | 0.19 | 0.31 | 0.22 | 0.1 | 2.6 |
| Difference in layer thickness of second layer ($\mu$M) | 0.06 | 0.07 | 0.11 | 0.22 | 0.41 | 0.32 | 0.1 | 3.6 |
| Interference fringe and electrophotographic characteristics | X | X | ○ | ⊚ | ⊚ | ⊚ | △ | X |

X Practically unusable
△ Practically satisfactory
○ Practically very good
⊚ Practically excellent

TABLE 7C

| NO. | 501C | 502C | 503C | 504C | 505C | 506C | 507C | 508C |
|---|---|---|---|---|---|---|---|---|
| Cylinder No. | 101 | 102 | 103 | 104 | 105 | 106 | 107 | 108 |
| Difference in layer thickness of first layer ($\mu$m) | 0.05 | 0.07 | 0.1 | 0.21 | 0.31 | 0.22 | 0.1 | 2.6 |
| Difference in layer thickness of second layer ($\mu$m) | 0.06 | 0.08 | 0.1 | 0.2 | 0.41 | 0.35 | 0.1 | 3.5 |
| Interference fringe and electrophotograhic characteristics | X | X | ○ | ⊚ | ⊚ | ⊚ | △ | X |

X Practically unusabe
△ Practically satisfactory
○ Practically very good
⊚ Practically excellent

TABLE 4C

| Name of layer | Starting gas | Flow rate (SCCM) | High frequency power (W) | Layer thickness ($\mu$m) |
|---|---|---|---|---|
| Charge injection preventive layer | $H_2$<br>$SiH_4$<br>$NH_3$<br>$B_2H_6$ | 300<br>150<br>30<br>0.24 | 160 | 3 |
| Photosensitive layer | $H_2$<br>$SiH_4$ | 300<br>300 | 300 | 20 |

TABLE 8C

| Name of layer | Starting gas | Flow rate (SSCM) | High frequency power (W) | Layer thickness ($\mu$m) |
|---|---|---|---|---|
| Charge injection preventive layer | $H_2$<br>$SiH_4$<br>$CH_4$<br>$B_2H_6$ | 300<br>150<br>15<br>0.45 | 170 | 2.8 |
| Photosensitive layer | $H_2$<br>$SiH_4$ | 300<br>300 | 200 | 21 |

TABLE 5C

| NO. | 401C | 402C | 403C | 404C | 405C | 406C | 407C | 408C |
|---|---|---|---|---|---|---|---|---|
| Cylinder NO. | 101 | 102 | 103 | 104 | 105 | 106 | 107 | 108 |
| Difference in layer thickness ($\mu$m) | 0.07 | 0.08 | 0.17 | 0.20 | 0.42 | 0.33 | 0.11 | 2.8 |
| Interference fringe and electrophotographic characteristics | X | X | ○ | ⊚ | ⊚ | ⊚ | △ | X |

X Practically unusable
△ Practically satisfactory
○ Practically very good
⊚ Practically excellent

TABLE 9C

| NO. | 901C | 902C | 903C | 904C | 905C | 906C | 907C | 908C |
|---|---|---|---|---|---|---|---|---|
| Cylinder NO. | 101 | 102 | 103 | 104 | 105 | 106 | 107 | 108 |
| Difference in layer thickness ($\mu$m) | 0.07 | 0.09 | 0.16 | 0.19 | 0.46 | 0.35 | 0.1 | 3.2 |
| Interference fringe and electro-Photographic characteristics | X | X | ○ | ⊚ | ⊚ | ⊚ | △ | X |

X Practically unusable
△ Practically satisfactory
○ Practically very good
⊚ Practically excellent

TABLE 6C

| Name of layer | Starting gas | Flow rate (SCCM) | High frequency power (W) | Layer thickness ($\mu$m) |
|---|---|---|---|---|
| Charge injection preventive layer | $H_2$<br>$SiH_4$<br>$NH_3$<br>$B_2H_6$ | 300<br>150<br>15<br>0.3 | 160 | 5 |
| Photosensitive layer | $H_2$<br>$SiH_4$ | 300<br>300 | 200 | 20 |

TABLE 10C

| Name of layer | Starting gas | Flow rate (SCCM) | High frequency power (W) | Layer thickness ($\mu$m) |
|---|---|---|---|---|
| Charge injection preventive layer | $H_2$<br>$SiH_4$<br>$CH_4$<br>$B_2H_6$ | 300<br>160<br>16<br>0.4 | 170 | 5.1 |
| Photosensitive layer | $H_2$<br>$SiH_4$ | 300<br>300 | 230 | 22 |

TABLE 11C

| NO. | 1101C | 1102C | 1103C | 1104C | 1105C | 1106C | 1107C | 1108C |
|---|---|---|---|---|---|---|---|---|
| Cylinder NO. | 101 | 102 | 103 | 104 | 105 | 106 | 107 | 108 |
| Difference in layer | 0.05 | 0.06 | 0.1 | 0.22 | 0.31 | 0.21 | 0.1 | 2.7 |

TABLE 11C-continued

| NO. | 1101C | 1102C | 1103C | 1104C | 1105C | 1106C | 1107C | 1108C |
|---|---|---|---|---|---|---|---|---|
| thickness of first layer ($\mu$m) Difference in layer thickness of second layer ($\mu$m) | 0.07 | 0.08 | 0.11 | 0.35 | 0.45 | 0.31 | 0.1 | 3.5 |
| Interference fringe and electrophotographic characteristics | X | X | ◯ | ⊚ | ⊚ | ⊚ | Δ | X |

X Practically unusable
Δ Practically satisfactory
⊚ Practically very good
◯ Practically excellent

TABLE 12C (Sample No. 1201C)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ NO | $SiH_4 = 50$ | $NO/SiH_4 = 3/10 \sim 0$ | 150 | 12 | 1 |
| Second layer | $SiH_4/He = 0.05$ | $SiH_4 = 50$ | $NO/SiH_4 = 3/10 \sim 0$ | 150 | 12 | 20 |

TABLE 13C (Sample No. 1202C)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 4 \times 10^{-3}$ $NO/SiH_4$ $2/10 \sim 0$ | 150 | 12 | 0.5 |
| Second layer | $SiH_4/He = 0.05$ | $SiH_4 = 50$ | $NO/SiH_4$ $3/10 \sim 0$ | 150 | 12 | 20 |

TABLE 14C (Sample No. 1203C)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 2 \times 10^{-4}$ $NO/SiH_4 = 1/10 \sim 1/100$ | 160 | 14 | 5 |
| Second layer | $SiH_4/He = 0.05$ | $SiH_4 = 50$ | $NO/SiH_4 = 1/100$ | 160 | 14 | 15 |

TABLE 15C (Sample No. 1204C)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ $B_2H_6/He = 10^{-3}$ NO | $SiH_4 = 50$ | $B_2H_6/SiH_4 = 2 \times 10^{-4}$ $NO/SiH_4 = 3/10 \sim 0$ | 160 | 14 | 1.0 |
| Second layer | $SiH_4/He = 0.05$ $B_2H_6/He = 10^{-3}$ | $SiH_4 = 50$ | $B_2H_6/SiH_4 = 2 \times 10^{-4}$ | 160 | 12 | 15 |

TABLE 16C

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | $SiH_4/He = 0.05$ $PH_3/He = 10^{-3}$ NO | $SiH_4 = 50$ | $PH_3/SiH_4 = 3 \times 10^{-4}$ $NO/SiH_4 = 3/10 \sim 0$ | 170 | 15 | 1 |

TABLE 16C-continued

| Layer constitution | Gases employed | Flow rate (SCCM) | Flow rate ratio | Discharging power (W) | Layer formation rate (Å/sec) | Layer thickness (μ) |
| --- | --- | --- | --- | --- | --- | --- |
| Second layer | SiH$_4$/He = 0.05 | SiH$_4$ = 50 |  | 170 | 15 | 20 |

What is claimed is:

1. A light receiving member comprising a light receiving layer of a multi-layer structure having at least one photosensitive layer comprising an amorphous material containing silicon atoms on a substrate, said photosensitive layer having at least one pair of nonparallel interfaces within a short range and said non-parallel interfaces being arranged in a large number in at least one direction within a plane perpendicular to the layer thickness direction.

2. A light receiving member according to claim 1, wherein the non-parallel interfaces are arranged regularly.

3. A light receiving member according to claim 1, wherein the non-parallel interfaces are arranged periodically.

4. A light receiving member according to claim 1, wherein the short range is 0.3 to 500μ.

5. A light receiving member according to claim 1, wherein the non-parallel interfaces are formed on the basis of the unevenness arranged regularly provided on the surface of said substrate.

6. A light receiving member according to claim 5, wherein the said unevenness is formed by inverted V type linear projections.

7. A light receiving member according to claim 6, wherein the shape of the longitudinal section of said inverted V type linear projection is substantially a isosceles triangle.

8. A light receiving member according to claim 6, wherein the shape of the longitudinal section of said inverted V type linear projection is substantially a right angled triangle.

9. A light receiving member according to claim 6, wherein the shape of the longitudinal section of said inverted V type linear projection is substantially a scalene triangle.

10. A light receiving member according to claim 1, wherein the substrate is cylindrical.

11. A light receiving member according to claim 10, wherein the inverted V type linear projection has a spiral structure within the plane of the substrate.

12. A light receiving member according to claim 11, wherein the spiral structure is a multiple spiral structure.

13. A light receiving member according to claim 6, wherein the inverted V type projection is divided in its edge line direction.

14. A light receiving member according to claim 10, wherein the edge line direction of the inverted V type linear projection is along the center axis of the cylindrical substrate.

15. A light receiving member according to claim 5, wherein the unevenness has inclined planes.

16. A light receiving member according to claim 15, wherein the inclined planes are mirror finished.

17. A light receiving member according to claim 5, wherein on the free surface of the light receiving layer is formed an unevenness arranged with the same pitch as that of the unevenness provided on the substrate surface.

18. A light receiving member according to claim 5, wherein the pitch of the recessed portions of the unevenness is 0.3 μm to 500 μm.

19. A light receiving member according to claim 5, wherein the maximum depth of the recessed portions of the unevenness is 0.1 μm to 5 μm.

20. A light receiving member according to claim 1, wherein the light receiving layer has a charge injection preventive layer as its constituent layer on the substrate side.

21. A light receiving member according to claim 20, wherein a substance (C) for controlling conductivity is contained in the charge injection preventive layer.

22. A light receiving member according to claim 21, wherein the content of the substance (C) for controlling conductivity in the charge injection preventive layer is 0.001 to $5 \times 10^4$ atomic ppm.

23. A light receiving member according to claim 20, wherein the charge injection preventive layer has a thickness of 30 Å to 10 μm.

24. A light receiving member according to claim 1, wherein the photosensitive layer has a thickness of 1 to 100 μm.

25. A light receiving member according to claim 1, wherein a substance for controlling conductivity is contained in the photosensitive layer.

26. A light receiving member according to claim 25, wherein the content of the substance for controlling conductivity in the photosensitive layer is 0.001 to 1000 atomic ppm.

27. A light receiving member according to claim 1, wherein hydrogen atoms are contained in the photosensitive layer.

28. A light receiving member according to claim 7, wherein the content of hydrogen atoms in the photosensitive layer is 1 to 40 atomic %.

29. A light receiving member according to claim 1, wherein halogen atoms are contained in the photosensitive layer.

30. A light receiving member according to claim 29, wherein the content of halogen atoms in the photosensitive layer is 1 to 40 atomic %.

31. A light receiving member according to claim 1, wherein hydrogen atoms and halogen atoms are contained in the photosensitive layer.

32. A light receiving member according to claim 31, wherein the sum of the contents of hydrogen atoms and halogen atoms in the photosensitive layer is 1 to 40 atomic %.

33. A light receiving member according to claim 1, wherein the light receiving layer has a barrier layer comprising an electrically insulating material on the substrate side as its constituent layer.

34. A light receiving member according to claim 33, wherein the electrically insulating material is selected from $Al_2O_3$, $SiO_2$, $Si_3N_4$ and polycarbonate.

35. A light receiving member according to claim 1, wherein the light receiving layer contains at least one kind of atoms selected from oxygen atoms, carbon atoms and nitrogen atoms.

36. A light receiving member according to claim 1, wherein the light receiving layer has a layer region (OCN) containing at least one kind of atoms (OCN) selected from oxygen atoms, carbon atoms and nitrogen atoms.

37. A light receiving member according to claim 36, wherein the distribution concentration C (OCN) of the atoms (OCN) contained in the layer region (OCN) is uniform in the layer thickness direction.

38. A light receiving member according to claim 36, wherein the distribution concentration C (OCN) of the atoms (OCN) contained in the layer region (OCN) is uniform in the layer thickness direction.

39. A light receiving member according to claim 36, wherein the layer region (OCN) is provided at the end portion on the substrate side of the light receiving layer.

40. A light receiving member according to claim 36, wherein the content of the atoms (OCN) in the layer region (OCN) is 0.001 to 50 atomic %.

41. A light receiving member according to claim 36, wherein the proportion of the layer thickness of the layer region (OCN) occupied in the light receiving layer is 2/5 or higher and the content of the atoms (OCN) in the layer region (OCN) is 30 atomic % or less.

42. An electrophotographic imge forming process comprising:
 (a) applying a charging treatment to the light receiving member of claim 1;
 (b) irradiating the light receiving member with a laser beam carrying information to form an electrostatic latent image; and
 (c) developing said electrostatic latent image.

* * * * *

UNITED STATES PATENT AND TRADEMARK OFFICE
CERTIFICATE OF CORRECTION

PATENT NO. : 4,650,736

DATED : March 17, 1987

INVENTOR(S) : KEISHI SAITOH, ET AL.

It is certified that error appears in the above-identified patent and that said Letters Patent is hereby corrected as shown below:

COLUMN 1

Line 7,    "invention" should read --Invention--.
    Line 15,   "prior art" should read --Prior Art--.

COLUMN 2

Line 9,    "an" should read --a--.

COLUMN 3

Line 66,   "so much" should read --greatly--.

COLUMN 4

Line 32,   "interferance" should read --interference--.

COLUMN 5

Line 10,   "ellel" should read --allel--.

COLUMN 6

Line 50,   "as" should be deleted.
    Line 63,   "as-" should read --as--.

COLUMN 7

Line 10,   "bite" should read --bit--.
    Line 29,   "-shape" should read -- -shaped--.

UNITED STATES PATENT AND TRADEMARK OFFICE
CERTIFICATE OF CORRECTION

PATENT NO. : 4,650,736

DATED : March 17, 1987

INVENTOR(S) : KEISHI SAITOH, ET AL.

It is certified that error appears in the above-identified patent and that said Letters Patent is hereby corrected as shown below:

COLUMN 8

Line 35,   "condition" should read --conduction--.

COLUMN 9

Line 11,   "tl" should read --Tl--.
    Line 17,   "substrance" should read --substance--.
    Line 19,   "be suitably be" should read --suitably be--.

COLUMN 11

Line 15,   "suitalbly" should read --suitably--.

COLUMN 14

Line 10,   "a-Si" should read --A-Si--.
    Line 19,   "a-Si" should read --A-Si--.

COLUMN 15

Line 6,    "comprised," should read --comprises,--.
    Line 67,   "$B_2H_6B_4H_{10}$" should read --$B_2H_6$, $B_4H_{10}$--.

COLUMN 16

Line 60,   "tegion" should read --region--.

COLUMN 17

Line 16,   "in to" should read --into--.
    Line 18,   "provile" should read --profile--.

UNITED STATES PATENT AND TRADEMARK OFFICE
CERTIFICATE OF CORRECTION

PATENT NO. : 4,650,736
DATED : March 17, 1987
INVENTOR(S) : KEISHI SAITOH, ET AL.

It is certified that error appears in the above-identified patent and that said Letters Patent is hereby corrected as shown below:

COLUMN 19

Line 25,   "was" should read --of--.

COLUMN 21

Line 1,    "sane" should read --sand--.

COLUMN 23

Line 39,   "enter" should read --center--.
    Line 61,   "enter" hsould read --center--.

COLUMN 24

Line 62,   "1026" should read --1206--.

COLUMN 25

Line 19,   "wet" should read --set--.

COLUMN 26

Line 10,   "was 2µ." should read --was 2µm.--.

COLUMN 28

Line 40,   "thus prepared" should read --thus-prepared--.
    Line 58,   "thus prepared" should read --thus-prepared--.
    Line 58,   "were" should read --was--.

UNITED STATES PATENT AND TRADEMARK OFFICE
CERTIFICATE OF CORRECTION

PATENT NO. : 4,650,736
DATED : March 17, 1987
INVENTOR(S) : KEISHI SAITOH, ET AL.

It is certified that error appears in the above-identified patent and that said Letters Patent is hereby corrected as shown below:

COLUMN 29

TBL 2A,  " Practically very good" should read
               Practically excellent --O Practically very good--.
                ● Practically excellent TBL 3A,  "Interference   X X O O " should read
               fringe --Interference X X O ● --.
                fringe

COLUMN 30

TBL 2B,  "O Practically excellent" should read
              --● Practically excellent--.

TBL 3B,  "Interference X X        Δ X" should read
              fringe

--Interference X X O ● ● ● Δ X--.
              fringe

TBL 3B,  " Practically very good" should read
               Practically excellent --O Practically very good--.
                ● Practically excellent

UNITED STATES PATENT AND TRADEMARK OFFICE
CERTIFICATE OF CORRECTION

PATENT NO. : 4,650,736
DATED : March 17, 1987
INVENTOR(S) : KEISHI SAITOH, ET AL.

It is certified that error appears in the above-identified patent and that said Letters Patent is hereby corrected as shown below:

COLUMN 33

TBL 3C, "μM" should read --μm--.

COLUMN 34

TBL 7C, "X Practically unusabe" should read
            --X Practically unusable--.

TBL 8C, "Flow rate" should read --Flow rate--.
            (SSCM)                   (SCCM)

TBL 9C, "Interference X X O ●" should read
            --Interference X X O O--.

TBL 9C, "Photographic" should read --photographic--.

COLUMN 35

TBL 11C, "● Practically very good" should read
            O Practically excellent --O Practically very good--.
            ● Practically excellent

COLUMN 37

Line 37, "a" should read --an--.

UNITED STATES PATENT AND TRADEMARK OFFICE
CERTIFICATE OF CORRECTION

PATENT NO. : 4,650,736

DATED : March 17, 1987

INVENTOR(S) : KEISHI SAITOH, ET AL.

It is certified that error appears in the above-identified patent and that said Letters Patent is hereby corrected as shown below:

COLUMN 39

Line 20, "uniform" should read --ununiform--.

COLUMN 40

Line 12, "imge" should read --image--.

Signed and Sealed this

Eleventh Day of August, 1987

Attest:

DONALD J. QUIGG

*Attesting Officer*  *Commissioner of Patents and Trademarks*